US009224496B2

United States Patent
Chung

(10) Patent No.: US 9,224,496 B2
(45) Date of Patent: Dec. 29, 2015

(54) CIRCUIT AND SYSTEM OF AGGREGATED AREA ANTI-FUSE IN CMOS PROCESSES

(76) Inventor: Shine C. Chung, San Jose, CA (US)

(*) Notice: Subject to any disclaimer, the term of this patent is extended or adjusted under 35 U.S.C. 154(b) by 626 days.

(21) Appl. No.: 13/072,783

(22) Filed: Mar. 28, 2011

(65) Prior Publication Data
US 2012/0039107 A1    Feb. 16, 2012

Related U.S. Application Data

(60) Provisional application No. 61/372,484, filed on Aug. 11, 2010.

(51) Int. Cl.
| G11C 17/00 | (2006.01) |
| G11C 11/00 | (2006.01) |
| G11C 17/12 | (2006.01) |
| H01L 27/06 | (2006.01) |
| H01L 23/525 | (2006.01) |

(Continued)

(52) U.S. Cl.
CPC ............ *G11C 17/12* (2013.01); *H01L 27/0629* (2013.01); *H01L 23/5252* (2013.01); *H01L 27/101* (2013.01); *H01L 29/1083* (2013.01); *H01L 29/7833* (2013.01); *H01L 2924/0002* (2013.01)

(58) Field of Classification Search
CPC .......... G11C 11/5628; G11C 11/5642; G11C 16/10; G11C 16/24; G11C 7/12; G11C 11/21; G11C 11/02; G11C 17/06; G11C 17/16
USPC ........ 365/104, 96, 225.7, 148, 158, 115, 171, 365/173, 174, 175
See application file for complete search history.

(56) References Cited

U.S. PATENT DOCUMENTS

| 3,198,670 A | 8/1965 | Nissim |
| 3,715,242 A | 2/1973 | Daniel |

(Continued)

FOREIGN PATENT DOCUMENTS

| CN | 1469473 A | 1/2004 |
| CN | 1691204 A | 11/2005 |

(Continued)

OTHER PUBLICATIONS

U.S. Appl. No. 13/471,704, filed May 15, 2012.
(Continued)

*Primary Examiner* — Hien Nguyen

(57) ABSTRACT

Gate oxide breakdown anti-fuse suffers notorious soft breakdown that reduces yield and reliability. This invention discloses circuit and system to enhance electrical field by blocking LDD so that the electrical field is higher and more focused near the drain junction, to make electrical field in the channel more uniform by creating slight conductive or conductive in part or all of the channel, or to neutralize excess carriers piled up in the oxide by applying alternative polarity pulses. The embodiments can be applied in part, all, or any combinations, depending on needs. This invention can be embodied as a 2 T anti-fuse cell having an access and a program MOS with drain area in the program MOS, or 1.5 T anti-fuse cell without any drain in the program MOS. Similarly this invention can also be embodied as a 1 T anti-fuse cell having a portion of the channel made conductive or slightly conductive to merge the access and program MOS into one device with drain area, or 0.5 T anti-fuse cell without any drain.

17 Claims, 18 Drawing Sheets

(51) Int. Cl.
    *H01L 27/10*    (2006.01)
    *H01L 29/10*    (2006.01)
    *H01L 29/78*    (2006.01)

(56) References Cited

U.S. PATENT DOCUMENTS

| | | | |
|---|---|---|---|
| 4,148,046 A | 4/1979 | Hendrickson et al. | |
| 4,192,059 A | 3/1980 | Khan et al. | |
| 4,642,674 A | 2/1987 | Schoofs | |
| 5,192,989 A | 3/1993 | Matsushita et al. | |
| 5,389,552 A | 2/1995 | Iranmanesh | |
| 5,447,876 A | 9/1995 | Moyer et al. | |
| 5,635,742 A | 6/1997 | Hoshi et al. | |
| 5,637,901 A | 6/1997 | Beigel et al. | |
| 5,723,890 A | 3/1998 | Fujihira et al. | |
| 5,757,046 A | 5/1998 | Fujihira et al. | |
| 5,761,148 A | 6/1998 | Allan et al. | |
| 5,962,903 A | 10/1999 | Sung et al. | |
| 6,002,156 A | 12/1999 | Lin | |
| 6,008,092 A | 12/1999 | Gould | |
| 6,034,882 A | 3/2000 | Johnson et al. | |
| 6,054,344 A | 4/2000 | Liang et al. | |
| 6,140,687 A | 10/2000 | Shimormura et al. | |
| 6,243,864 B1 | 6/2001 | Odani et al. | |
| 6,249,472 B1* | 6/2001 | Tamura et al. | 365/225.7 |
| 6,346,727 B1 | 2/2002 | Ohtomo | |
| 6,388,292 B1 | 5/2002 | Lin | |
| 6,400,540 B1 | 6/2002 | Chang | |
| 6,405,160 B1 | 6/2002 | Djaja et al. | |
| 6,461,934 B2 | 10/2002 | Nishida et al. | |
| 6,483,734 B1 | 11/2002 | Sharma et al. | |
| 6,597,629 B1 | 7/2003 | Raszka et al. | |
| 6,611,043 B2 | 8/2003 | Takiguchi | |
| 6,731,535 B1 | 5/2004 | Ooishi et al. | |
| 6,770,953 B2 | 8/2004 | Boeck et al. | |
| 6,798,684 B2 | 9/2004 | Low et al. | |
| 6,803,804 B2 | 10/2004 | Madurawe | |
| 6,813,705 B2 | 11/2004 | Duesterwald et al. | |
| 6,897,543 B1 | 5/2005 | Huang et al. | |
| 6,934,176 B2 | 8/2005 | Low et al. | |
| 6,944,083 B2 | 9/2005 | Pedlow | |
| 6,967,879 B2 | 11/2005 | Mizukoshi | |
| 7,009,182 B2 | 3/2006 | Kannan et al. | |
| 7,102,951 B2 | 9/2006 | Paillet et al. | |
| 7,167,397 B2 | 1/2007 | Paillet et al. | |
| 7,211,843 B2 | 5/2007 | Low et al. | |
| 7,212,432 B2 | 5/2007 | Ferrant et | |
| 7,224,598 B2 | 5/2007 | Perner | |
| 7,263,027 B2 | 8/2007 | Kim et al. | |
| 7,294,542 B2 | 11/2007 | Okushima | |
| 7,369,452 B2 | 5/2008 | Kenkare et al. | |
| 7,391,064 B1 | 6/2008 | Tripsas et al. | |
| 7,411,844 B2 | 8/2008 | Nitzan et al. | |
| 7,439,608 B2 | 10/2008 | Arendt | |
| 7,461,371 B2 | 12/2008 | Luo et al. | |
| 7,573,762 B2 | 8/2009 | Kenkare et al. | |
| 7,589,367 B2 | 9/2009 | Oh et al. | |
| 7,609,578 B2 | 10/2009 | Buer et al. | |
| 7,660,181 B2 | 2/2010 | Kumar et al. | |
| 7,696,017 B1 | 4/2010 | Tripsas et al. | |
| 7,701,038 B2 | 4/2010 | Chen et al. | |
| 7,764,532 B2 | 7/2010 | Kurjanowicz et al. | |
| 7,772,591 B1 | 8/2010 | Shih et al. | |
| 7,802,057 B2 | 9/2010 | Iyer et al. | |
| 7,808,815 B2 | 10/2010 | Ro et al. | |
| 7,830,697 B2 | 11/2010 | Herner | |
| 7,833,823 B2 | 11/2010 | Klersy | |
| 7,852,656 B2 | 12/2010 | Shin et al. | |
| 7,859,920 B2 | 12/2010 | Jung et al. | |
| 7,889,204 B2 | 2/2011 | Hansen et al. | |
| 7,910,999 B2 | 3/2011 | Lee et al. | |
| 8,008,723 B2 | 8/2011 | Nagai | |
| 8,050,129 B2 | 11/2011 | Liu et al. | |
| 8,089,137 B2 | 1/2012 | Lung et al. | |
| 8,115,280 B2 | 2/2012 | Chen et al. | |
| 8,119,048 B2 | 2/2012 | Nishimura | |
| 8,168,538 B2 | 5/2012 | Chen et al. | |
| 8,174,063 B2 | 5/2012 | Lu et al. | |
| 8,174,922 B2* | 5/2012 | Naritake | 365/225.7 |
| 8,179,711 B2 | 5/2012 | Kim et al. | |
| 8,183,665 B2 | 5/2012 | Bertin et al. | |
| 8,217,490 B2 | 7/2012 | Bertin et al. | |
| 8,233,316 B2 | 7/2012 | Liu | |
| 8,339,079 B2 | 12/2012 | Tamada | |
| 8,369,166 B2 | 2/2013 | Kurjanowicz et al. | |
| 8,373,254 B2 | 2/2013 | Chen et al. | |
| 8,380,768 B2 | 2/2013 | Hoefler | |
| 8,415,764 B2 | 4/2013 | Chung | |
| 8,482,972 B2 | 7/2013 | Chung | |
| 8,488,359 B2 | 7/2013 | Chung | |
| 8,488,364 B2 | 7/2013 | Chung | |
| 8,514,606 B2 | 8/2013 | Chung | |
| 8,526,254 B2 | 9/2013 | Kurjanowicz et al. | |
| 8,559,208 B2 | 10/2013 | Chung | |
| 8,570,800 B2 | 10/2013 | Chung | |
| 8,576,602 B2 | 11/2013 | Chung | |
| 8,643,085 B2 | 2/2014 | Pfirsch | |
| 8,644,049 B2 | 2/2014 | Chung | |
| 8,648,349 B2 | 2/2014 | Masuda et al. | |
| 8,649,203 B2 | 2/2014 | Chung | |
| 8,680,620 B2 | 3/2014 | Salcedo | |
| 8,699,259 B2 | 4/2014 | Zhang et al. | |
| 8,760,904 B2 | 6/2014 | Chung | |
| 8,817,563 B2 | 8/2014 | Chung | |
| 8,830,720 B2 | 9/2014 | Chung | |
| 8,848,423 B2 | 9/2014 | Chung | |
| 8,854,859 B2 | 10/2014 | Chung | |
| 8,861,249 B2 | 10/2014 | Chung | |
| 8,913,415 B2 | 12/2014 | Chung | |
| 8,913,449 B2 | 12/2014 | Chung | |
| 8,923,085 B2 | 12/2014 | Chung | |
| 8,988,965 B2 | 3/2015 | Chung | |
| 9,019,742 B2 | 4/2015 | Chung | |
| 9,019,791 B2 | 4/2015 | Chung | |
| 9,025,357 B2 | 5/2015 | Chung | |
| 9,070,437 B2 | 6/2015 | Chung | |
| 2002/0075744 A1 | 6/2002 | McCollum | |
| 2002/0168821 A1 | 11/2002 | Williams et al. | |
| 2002/0196659 A1 | 12/2002 | Hurst et al. | |
| 2003/0104860 A1 | 6/2003 | Cannon et al. | |
| 2003/0135709 A1 | 7/2003 | Niles et al. | |
| 2003/0169625 A1 | 9/2003 | Hush et al. | |
| 2004/0057271 A1 | 3/2004 | Parkinson | |
| 2004/0113183 A1 | 6/2004 | Karpov et al. | |
| 2004/0130924 A1 | 7/2004 | Ma et al. | |
| 2005/0060500 A1 | 3/2005 | Luo et al. | |
| 2005/0062110 A1 | 3/2005 | Dietz et al. | |
| 2005/0110081 A1 | 5/2005 | Pendharkar | |
| 2005/0124116 A1 | 6/2005 | Hsu et al. | |
| 2005/0146962 A1 | 7/2005 | Schreck | |
| 2005/0242386 A1 | 11/2005 | Ang | |
| 2006/0072357 A1 | 4/2006 | Wicker | |
| 2006/0092689 A1 | 5/2006 | Braun et al. | |
| 2006/0104111 A1 | 5/2006 | Tripsas et al. | |
| 2006/0120148 A1 | 6/2006 | Kim et al. | |
| 2006/0129782 A1 | 6/2006 | Bansal et al. | |
| 2006/0215440 A1 | 9/2006 | Cho et al. | |
| 2006/0244099 A1 | 11/2006 | Kurjanowicz | |
| 2007/0004160 A1 | 1/2007 | Voldman | |
| 2007/0057323 A1 | 3/2007 | Furukawa et al. | |
| 2007/0081377 A1 | 4/2007 | Zheng et al. | |
| 2007/0133341 A1 | 6/2007 | Lee et al. | |
| 2007/0138549 A1 | 6/2007 | Wu et al. | |
| 2007/0223266 A1 | 9/2007 | Chen | |
| 2007/0279978 A1 | 12/2007 | Ho et al. | |
| 2008/0025068 A1 | 1/2008 | Scheuerlein et al. | |
| 2008/0028134 A1 | 1/2008 | Matsubara et al. | |
| 2008/0044959 A1 | 2/2008 | Cheng et al. | |
| 2008/0067601 A1 | 3/2008 | Chen | |
| 2008/0105878 A1 | 5/2008 | Ohara | |
| 2008/0151612 A1 | 6/2008 | Pellizzer et al. | |
| 2008/0170429 A1 | 7/2008 | Bertin et al. | |
| 2008/0175060 A1 | 7/2008 | Liu | |
| 2008/0220560 A1 | 9/2008 | Klersy | |

(56) References Cited

U.S. PATENT DOCUMENTS

| | | |
|---|---|---|
| 2008/0225567 A1 | 9/2008 | Burr et al. |
| 2008/0280401 A1 | 11/2008 | Burr et al. |
| 2008/0316852 A1 | 12/2008 | Matsufuji et al. |
| 2009/0055617 A1 | 2/2009 | Bansal et al. |
| 2009/0115021 A1 | 5/2009 | Moriwaki |
| 2009/0168493 A1 | 7/2009 | Kim et al. |
| 2009/0172315 A1 | 7/2009 | Iyer et al. |
| 2009/0180310 A1 | 7/2009 | Shimomura et al. |
| 2009/0194839 A1 | 8/2009 | Bertin et al. |
| 2009/0213660 A1 | 8/2009 | Pikhay et al. |
| 2009/0219756 A1 | 9/2009 | Schroegmeier et al. |
| 2009/0309089 A1 | 12/2009 | Hsia et al. |
| 2010/0027326 A1 | 2/2010 | Kim et al. |
| 2010/0061136 A1 | 3/2010 | Koyama et al. |
| 2010/0085798 A1 | 4/2010 | Lu et al. |
| 2010/0091546 A1 | 4/2010 | Liu et al. |
| 2010/0142254 A1 | 6/2010 | Choi et al. |
| 2010/0157651 A1 | 6/2010 | Kumar et al. |
| 2010/0171086 A1 | 7/2010 | Lung et al. |
| 2010/0232203 A1 | 9/2010 | Chung et al. |
| 2010/0238701 A1 | 9/2010 | Tsukamoto et al. |
| 2010/0246237 A1* | 9/2010 | Borot et al. ............ 365/96 |
| 2010/0277967 A1 | 11/2010 | Lee et al. |
| 2010/0301304 A1 | 12/2010 | Chen et al. |
| 2011/0022648 A1 | 1/2011 | Harris et al. |
| 2011/0062557 A1 | 3/2011 | Bandyopadhyay et al. |
| 2011/0128772 A1 | 6/2011 | Kim et al. |
| 2011/0145777 A1 | 6/2011 | Iyer et al. |
| 2011/0175199 A1 | 7/2011 | Lin et al. |
| 2011/0222330 A1 | 9/2011 | Lee et al. |
| 2011/0260289 A1 | 10/2011 | Oyamada |
| 2011/0297912 A1 | 12/2011 | Samachisa et al. |
| 2011/0310655 A1 | 12/2011 | Kreupl et al. |
| 2011/0312166 A1 | 12/2011 | Yedinak et al. |
| 2012/0032303 A1 | 2/2012 | Elkareh et al. |
| 2012/0039107 A1 | 2/2012 | Chung |
| 2012/0044736 A1 | 2/2012 | Chung |
| 2012/0044737 A1 | 2/2012 | Chung |
| 2012/0044738 A1 | 2/2012 | Chung |
| 2012/0044739 A1 | 2/2012 | Chung |
| 2012/0044740 A1 | 2/2012 | Chung |
| 2012/0044743 A1 | 2/2012 | Chung |
| 2012/0044744 A1 | 2/2012 | Chung |
| 2012/0044745 A1 | 2/2012 | Chung |
| 2012/0044746 A1 | 2/2012 | Chung |
| 2012/0044747 A1 | 2/2012 | Chung |
| 2012/0044748 A1 | 2/2012 | Chung |
| 2012/0044753 A1 | 2/2012 | Chung |
| 2012/0044756 A1 | 2/2012 | Chung |
| 2012/0044757 A1 | 2/2012 | Chung |
| 2012/0044758 A1 | 2/2012 | Chung |
| 2012/0047322 A1 | 2/2012 | Chung |
| 2012/0074460 A1 | 3/2012 | Kitagawa |
| 2012/0106231 A1 | 5/2012 | Chung |
| 2012/0147653 A1 | 6/2012 | Chung |
| 2012/0147657 A1 | 6/2012 | Sekar et al. |
| 2012/0209888 A1 | 8/2012 | Chung |
| 2012/0224406 A1 | 9/2012 | Chung |
| 2012/0256292 A1 | 10/2012 | Yu et al. |
| 2012/0287730 A1 | 11/2012 | Kim |
| 2012/0314472 A1 | 12/2012 | Chung |
| 2012/0314473 A1 | 12/2012 | Chung |
| 2012/0320656 A1 | 12/2012 | Chung |
| 2012/0320657 A1 | 12/2012 | Chung |
| 2013/0148409 A1 | 6/2013 | Chung |
| 2013/0161780 A1 | 6/2013 | Kizilyalli et al. |
| 2013/0189829 A1 | 7/2013 | Mieczkowski et al. |
| 2013/0200488 A1 | 8/2013 | Chung |
| 2013/0201745 A1 | 8/2013 | Chung |
| 2013/0201746 A1 | 8/2013 | Chung |
| 2013/0201748 A1 | 8/2013 | Chung |
| 2013/0201749 A1 | 8/2013 | Chung |
| 2013/0208526 A1 | 8/2013 | Chung |
| 2013/0215663 A1 | 8/2013 | Chung |
| 2013/0235644 A1 | 9/2013 | Chung |
| 2013/0268526 A1 | 10/2013 | Johns et al. |
| 2013/0308366 A1 | 11/2013 | Chung |
| 2014/0010032 A1 | 1/2014 | Seshadri et al. |
| 2014/0016394 A1 | 1/2014 | Chung et al. |
| 2014/0071726 A1 | 3/2014 | Chung |
| 2014/0092674 A1 | 4/2014 | Chung |
| 2014/0124871 A1 | 5/2014 | Ko et al. |
| 2014/0124895 A1 | 5/2014 | Salzman et al. |
| 2014/0126266 A1 | 5/2014 | Chung |
| 2014/0131710 A1 | 5/2014 | Chung |
| 2014/0131711 A1 | 5/2014 | Chung |
| 2014/0131764 A1 | 5/2014 | Chung |
| 2014/0133056 A1 | 5/2014 | Chung |
| 2014/0160830 A1 | 6/2014 | Chung |
| 2014/0211567 A1 | 7/2014 | Chung |
| 2014/0269135 A1 | 9/2014 | Chung |
| 2014/0340954 A1 | 11/2014 | Chung |
| 2015/0003142 A1 | 1/2015 | Chung |
| 2015/0003143 A1 | 1/2015 | Chung |
| 2015/0009743 A1 | 1/2015 | Chung |
| 2015/0014785 A1 | 1/2015 | Chung |
| 2015/0021543 A1 | 1/2015 | Chung |
| 2015/0029777 A1 | 1/2015 | Chung |
| 2015/0078060 A1 | 3/2015 | Chung |

FOREIGN PATENT DOCUMENTS

| | | |
|---|---|---|
| CN | 101083227 A | 5/2007 |
| CN | 101057330 A | 10/2007 |
| CN | 101188140 A | 5/2008 |
| CN | 101271881 A | 9/2008 |
| CN | 101483062 A | 7/2009 |
| CN | 101728412 A | 6/2010 |
| EP | 1367596 A1 | 12/2003 |
| JP | 03-264814 | 11/1991 |
| TW | I309081 | 4/2009 |

OTHER PUBLICATIONS

U.S. Appl. No. 13/026,650, filed Feb. 14, 2011.
U.S. Appl. No. 13/026,656, filed Feb. 14, 2011.
U.S. Appl. No. 13/026,664, filed Feb. 14, 2011.
U.S. Appl. No. 13/026,678, filed Feb. 14, 2011.
U.S. Appl. No. 13/026,692, filed Feb. 14, 2011.
U.S. Appl. No. 13/026,704, filed Feb. 14, 2011.
U.S. Appl. No. 13/026,717, filed Feb. 14, 2011.
U. S. Appl. No. 13/026,725, filed Feb. 14, 2011.
U.S. Appl. No. 13/026,752, filed Feb. 14, 2011.
U.S. Appl. No. 13/026,771, filed Feb. 14, 2011.
U.S. Appl. No. 13/026,783, filed Feb. 14, 2011.
U.S. Appl. No. 13/026,835, filed Feb. 14, 2011.
U.S. Appl. No. 13/026,840, filed Feb. 14, 2011.
U.S. Appl. No. 13/026,852, filed Feb. 14, 2011.
U.S. Appl. No. 13/214,198, filed Aug. 21, 2011.
U.S. Appl. No. 13/590,044, filed Aug. 20, 2012.
U.S. Appl. No. 13/590,047, filed Aug. 20, 2012.
U.S. Appl. No. 13/590,049, filed Aug. 20, 2012.
U.S. Appl. No. 13/590,050, filed Aug. 20, 2012.
U.S. Appl. No. 13/214,183, filed Aug. 20, 2011.
U.S. Appl. No. 13/288,843, filed Nov. 3, 2011.
U.S. Appl. No. 13/314,444, filed Dec. 8, 2011.
U.S. Appl. No. 13/397,673, filed Feb. 15, 2012.
U.S. Appl. No. 13/571,797, filed Aug. 10, 2012.
U.S. Appl. No. 13/590,044, filed Aug. 20. 2012.
U.S. Appl. No. 13/590,047, filed Aug. 20. 2012.
U.S. Appl. No. 13/590,049, filed Aug. 20. 2012.
U.S. Appl. No. 13/590,050, filed Aug. 20. 2012.
U.S. Appl. No. 13/678,539, filed Nov. 15, 2012.
U.S. Appl. No. 13/678,544, filed Nov. 15, 2012.
U.S. Appl. No. 13/678,541, filed Nov. 15, 2012.
U.S. Appl. No. 13/678,543, filed Nov. 15, 2012.
Ahn, S.J. et al., "Highly Reliable 50nm Contact Cell Technology for 256Mb PRAM," IEEE VLSI Tech Symp., Jun. 2005, pp. 98-99.
Alavi, Mohsen, et al., "A PROM Element Based on Salicide Allgomeration of Poly Fuses in a CMOS Logic Process," IEEE IEDM, 97, pp. 855-858.

(56) References Cited

OTHER PUBLICATIONS

Andre, T. W. et al., "A 4-Mb 0.18um 1T1MTJ Toggle MRAM With Balanced Three Input Sensing Scheme and Locally Mirrored Unidirectional Write Drivers," IEEE J. of Solid-State Circuits, vol. 40, No. 1, Jan. 2005, pp. 301-309.

Ang, Boon et al., "NiSi Polysilicon Fuse Reliability in 65nm Logic CMOS Technology," IEEE Trans. on Dev. Mat. Rd. vol. 7, No. 2, Jun. 2007, pp. 298-303.

Aziz, A. et al., "Lateral Polysilicon n+p Diodes: Effect of the Grain boundaries and of the p-Implemented Doping Level on the I-V and C-V Characteristics," Springer Proceedings in Physics , vol. 54, 1991, pp. 318-322.

Aziz, A. et al., "Lateral Polysilicon PN Diodes: Current-Voltage Characteristics Simulation Between 200K and 400K a Numerical Approach," IEEE Trans. On Elec. Dev., vol. 41, No. 2, Feb, 1994, pp. 204-211.

Banerjee, Kaustav et al., "High Current Effects in Silicide Films for Sub-0.25um VLSI Technologies," IEEE 36th IRPS, 1998, pp. 284-292.

Bedeschi, F. et al., "4-Mb MOSFET-Selected uTrench Phase-Change Memory Experimental Chip," IEEE J. of Solid-State Circuits, vol. 40, No. 7, Jul. 2005, pp. 1557-1565.

Bedeschi, F. et al., "A Bipolar-Selected Phase Change Memory Featuring Multi-Level Cell Storage," IEEE J. Sol. Stat. Cir., vol. 44, No. 1, Jan., 2009, pp. 217-227.

Bedeschi, F. et al., "A Fully Symmetrical Sense Amplifier for Nonvolatile Memories," IEEE. Int. Symp. On Circuits and Systems, (ISCAS), vol. 2, 2004, pp. 625-628.

Bedeschi, F. et al., "An 8Mb Demonstrator for High-Density 1.8V Phase-Change Memories," Vlis Cir. Symp, Jun. 2004, pp. 442-445.

Bedeschi, F. et al., "Set and Reset Pulse Characterization in BJT-Selected Phase-Change Memory," IEEE Int. Symp. On Circuits and Systems (ISCAS), 2005, pp. 1270-1273.

Braganca, P. M. et al., "A Three-Terminal Approach to Developing Spin-Torque Written Magnetic Random Access Memory Cells," IEEE Trans. on Nano. vol. 8, No. 2, Mar. 2009, pp. 190-195.

Cagli, C. et al., "Evidence for threshold switching in the set process of NiO-based RRAM and physical modeling for set, reset, retention and disturb prediction," IEEE IEDM, 2008, pp. 1-4.

Chan, W. T. et al., "CMOS Compatible Zero-Mask One-Time Programmable (OTP) Memory Design," Proc. Int. Conf. Solid State Integr. Cir. Tech., Beijing, China, Oct. 20-23, 2008, pp. 861-864.

Chan, Wan Tim, et al., "CMOS Compatible Zero-Mask One Time Programmable Memory Design", Master Thesis, Hong-Kong University of Science and Technologies, 2008.

Chang, Meng-Fan et al., "Circuit Design Challenges in Embedded Memory and Resistive Ram (RRAM) for Mobile SoC and 3D-IC", Design Automation Conference (ASP-DAC), 16th Asia and South Pacific, 2011, pp. 197-203.

Cheng, Yu-Hsing et al., "Failure Analysis and Optimization of Metal Fuses for Post Package Trimming," IEEE 45th IRPS, 2007, pp. 616-617.

Chiu, Pi-Feng et al., "A Low Store Energy, Low VDDmin, Nonvolatile 8T2R SRAM with 3D Stacked RRAM Devices for Low Power Mobile Applications," IEEE VLSI Cir./Tech Symp., Jun. 2010, pp. 229-230.

Cho, Woo Yeong et al., "A 0.18um 3.0V 64Mb Non-Volatile Phase-Transition Random-Access Memory (PRAM)," ISSCC, Feb. 2004, Sec. 2-1.

Choi, Sang-Jun et al., "Improvement of CBRAM Resistance Window by Scaling Down Electrode Size in Pure-GeTe Film," IEEE Elec. Dev., vol. 30, No. 2, Feb., 2009, pp. 120-122.

Choi, Youngdon et al., "A 20nm 1.8V 8Gb PRAM with 40MB/s Program Bandwidth," IEEE ISSCC, 2012, pp. 46-47.

Chung, S. et al., "A 1.25um2 Cell 32Kb Electrical Fuse Memory in 32nm CMOS with 700mV Vddmin and Parallel/Serial Interface," VLSI Cir. Symp., Jun. 2009, pp. 30-31.

Chung, S. et al., "A 512x8 Electrical Fuse Memory with 15um2 Cells Using 8-sq Asymmetrical Fuse and Core Devices in 90nm CMOS," VLSI Cir. Symp., Jun. 2007, pp. 74-75.

Crowley, Matthew et al., "512Mb PROM with 8 Layers of Antifuse/Diode Cells," IEEE ISSCC 2003, Sec. 16.4.

De Sandre, Guido et al., "A 4Mb LV MOS-Selected Embedded Phase Change Memory in 90nm Standard CMOS Technology," IEEE J. Sol. Stat. Cir, vol. 46. No. 1, Jan. 2011, pp. 52-63.

De Sandre, Guido et al., "A 90nm 4Mb Embedded Phase-Change Memory with 1.2V 12ns Read Access Time and 1MB/s Write Throughput," ISSCC 2010, Sec. 14.7.

Desikan, Rajagopalan et al., "On-Chip MRAM as a High-Bandwidth Low-Latency Replacement for DRAM Physical Memories," Tech Report TR-02-47, Dept. Of Computer Science, University of Texas, Austin, Sep. 27, 2002, 18 pages.

Dietrich, Stefan et al., "A Nonvolatile 2-Mbit CBRAM Memory Core Featuring Advanced Read and Program Control," IEEE J. Of Solid-Stat Cir., vol. 42, No. 4, Apr. 2007, pp. 839-845.

Dion, Michael J., "Reservoir Modeling for Electromigration Improvement of Metal Systems with Refractory Barriers," IEEE 39th IRPS, 2001, pp. 327-333.

Doom, T. S. et al., "Ultra-fast Programming of Silicided Polysilicon Fuses Based on New Insights in the Programming Physics," IEEE IEDM, 2005, pp. 667-670.

Doom, T. S., "Detailed Qualitative Model for the Programming Physics of Silicided Polysilicon Fuses," IEEE Trans. on Elec. Dev. vol. 54, No. 12, Dec., 2007, pp. 3285-3291.

Durlam, M. et al., "A 1-Mbit MRAM Based on 1T1MTJ Bit Cell Integrated With Copper Interconnects," IEEE J. Of Solid-State Circuits, vol. 38, No. 5, May 2003, pp. 769-773.

Engel, B. et al., "The Science and Technology of Magnetoresistive Tunneling Memory," IEEE Tran. on Nanotechnology, vol. 1, No. 1, Mar. 2002, pp. 32-38.

Engel, B.N. et al., "A 4Mb Toggle MRAM Based on a Novel bit and Switching Method," IEEE Trans. on Mag. vol. 41, No. 1, Jan. 2005, pp. 132-136.

Fellner, Johannes, et al., "Lifetime Study for a Poly Fuse in a 0.35um Polycide CMOS Process," IEEE 43rd IRPS, 2005, pp. 446-449.

Gao, B. et al., "Oxide-Based RRAM: Uniformity Improvement Using A New Material-Oriented Methodology," IEEE VLSI Tech. Symp., Jun. 2009, pp. 30-31.

Gao, B. et al., "Oxide-Based RRAM Switching Mechanism: A New Ion-Transport-Recombination Model," IEDM, Dec. 2008, pp. 563-566.

Gill, M. et al., "Ovonic Unified Memory-A High Performance Nonvolatile Memory Technology for Stand-Alone Memory and Embedded Applications," IEEE, ISSCC Dig. of Tech. Paper, Feb. 2002, pp. 202-203.

Gogl, D. et al., "A 16-Mb MRAM Featuring Bootstrapped Write Drivers," IEEE J. of Solid-State Circuits, vol. 40, No. 4, Apr. 2005, pp. 902-908.

Gopalan, C. et al., Demonstration of Conductive Bridging Random Access Memory (CBRAM) in Logic CMOS Process, IEEE Int. Memory Workshop, 2010, pp. 1-4.

Ha, Daewon and Kim, Kinam, "Recent Advances in High Density Phase Change.Memory (PRAM)," IEEE VLSI Tech. Symp. Jun. 2007.

Hosoi, Y. et al., "High Speed Unipolar Switching Resistance RAM (RRAM).Technology," IEEE IEDM, Dec. 2006, pp. 1-4.

Hosomi, M. et al., "A Novel Nonvolatile Memory with Spin Torque Transfer Magnetization Switching: Spin-RAM," IEEE IEDM Dig. of Tech. Paper, Dec. 2005, pp. 459-463.

Huang, Chia-En et al., "A New CMOS Logic Anti-Fuse Cell with Programmable Contact," IEEE IEDM Tech. Dig. 2007, pp. 48-51.

Im, Jay et al., "Characterization of Silicided Polysilicon Fuse Implemented in 65nm CMOS Technology," 7th Annual Non-Volatile Memory Technology Symp, (NVMTS) 2006, pp. 55-57.

Jin, Li-Yan et al., "Low-Area 1-Kb Multi-Bit OTP IP Design," IEEE 8th Int. Conf.On ASIC (ASICON), 2009. pp. 629-632.

Johnson, Mark et al., "512Mb PROM with a Three-Dimensional Array of Diode/Antifuse Memory Cells," IEEE J. of Sol. Stat. Cir., vol. 38, No. 11, Nov. 2003, pp. 1920-1928.

Kalnitsy, Alexander et al., "CoSi2 Integrated Fuses on Poly Silicon for Low Voltage 0.18um CMOS Applications," IEEE IEDM 1999, pp. 765-768.

(56) References Cited

OTHER PUBLICATIONS

Kang, Han-Byul et al., "Electromigration of NiSi Poly Gated Electrical Fuse and Its Resistance Behaviors Induced by High Temperature," IEEE IRPS, 2010, pp. 265-270.

Kang, Sangbeom et al., "A 0.1um 1.8V 256Mb Phase-Change Random Access.Memory (PRAM) with 66Mhz Synchronous Burst-Read," IEEE J. of Sol. Stat. Cir. vol. 42. No. 1, Jan. 2007, pp. 210-218.

Kawahara, T. et al., "2Mb Spin-Transfer Torque RAM (SPRAM) with Bit-by-Bit Bidirectional Current Write and Parallelizing-Direction Current Read," IEEE ISSCC Dig. of Tech. Paper, Feb. 2007, pp. 480-481.

Ker, Ming-Dou et al., "High-Current Characterization of Polysilicon Diode for Electrostatic Discharge Protection in Sub-Quarter-Micron Complementary Metal Oxide Semiconductor Technology," Jpn. J. Appl. Phys. vol. 42 (2003) pp. 3377-3378.

Ker, Ming-Dou et al., "Ultra-High-Voltage Charge Pump Circuit in Low-Voltage Bulk CMOS Processes With Polysilicon Diodes," IEEE Trans. on Cir. And Sys.-II: Exp. Brief., vol. 54, No. 1, Jan. 2007, pp. 47-51.

Kim, Deok-Kee et al., "An Investigation of Electrical Current Induced Phase.Transitions in the NiPtSi/Polysilicon System," J. App. Phy. 103, 073708 (2008).

Kim, I. S. et al., "High Performance PRAM Cell Scalable to sub-20nm Technology with below 4F2 Cell Size, Extendable to DRAM Applications," IEEE VLSI Tech. Symp., Jun. 2010, pp. 203-204.

Kim, Jinbong et al., "3-Transistor Antifuse OTP ROM Array Using Standard CMOA Process," IEEE VLSI Cir. Symposium, Jun. 2003, pp. 239-242.

Kim, O. et al., "CMOS trimming circuit based on polysilicon fusing," Elec. Lett. vol. 34, No. 4, pp. 355-356, Feb. 1998.

Klee, V. et al., "A 0.13um Logic-Based Embedded DRAM Technology with.Electrical Fuses, Cu Interconnect in SiLK, sub-7ns Random Access Time and its Extension to the 0.10um Generation," IEEE IEDM, 2001, pp. 407-410.

Kothandaramam, C. et al., "Electrically programmable fuse (eFUSE) using electromigration in silicides," IEEE Elec. Dev. Lett., vol. 23, No. 9, pp. 523-525, Sep. 2002.

Kulkarni, S. et al., "High-Density 3-D Metal-Fuse PROM Featuring 1.37um2 1T1R Bit Cell in 32nm High-K Metal-Gate CMOS Technology," VLSI Cir. Symp., Jun. 2009 pp. 28-29.

Kulkarni, S. et al., "A 4Kb Metal-Fuse OTP-ROM Macro Featuring a 2V Programmable 1.37um2 1T1R Bit Cell in 32nm High-K Metal-Gate CMOS," IEEE J. of Sol. Stat. Cir, vol., 45, No. 4, Apr. 2010, pp. 863-868.

Kund, Michael et al., "Conductive Bridging RAM (CBRAM): An Emerging Non-Volatile Memory Technology Scalable to Sub 20nm," IEEE IEDM 2005, pp. 754-757.

Lai, Han-Chao et al., "A 0.26um2 U-Shaped Nitride-Based Programming Cell on Pure 90nm CMOS Technology," IEEE Elec. Dev. Lett. vol. 28, No. 9, Sep. 2007, pp. 837-839.

Lai, S., "Current Status of the Phase Change Memory and Its Future," IEEE Iedm Dig. of Tech. Paper, Dec. 2003, pp. 255-258.

Lee, H.Y. et al., "Low Power and High Speed Bipolar Switching with A Thin Reactive Ti Buffer Layer in Robust HfO2 Based RRAM," IEEE IEDM, 2008, pp. 1-4.

Lee, K.J., et al., "A 90nm 1.8V 512Mb Diode-Switch PRAM with 266MB/s Read Throughout," IEEE ISSCC, Dig. of Tech. Paper, Feb. 2007, 3 pgs.

Lee, Kwang-Jin et al., "A 90nm 1.8V 512Mb Diode-Switch PRAM with 266MB/s Read Throughput," IEEE J. of Sol. Stat. Cir., vol. 43, No. 1, Jan. 2008, pp. 150-162.

Lee, M.-J. et al., "Stack Friendly all-Oxide 3D RRAM Using GaInZnO Peripheral TFT Realized Over Glass Substrates," IEDM, Dec. 2008. pp. 1-4.

Lee, Man Chiu et al., "OTP Memory for Low Cost Passive RFID Tags," IEEE Conf. on Electron Devices and Solid-State Circuits (EDSSC), 2007, pp. 633-636.

Liaw, Corvin et al., "The Conductive Bridging Random Access Memory (CBRAM): A Non-volatile Multi-Level Memory Technology," 37th European Solid-State Device Research Conference (ESSDERC), 2007, pp. 226-229.

Lim, Kyunam et al., "Bit Line Coupling Scheme and Electrical Fuse Circuit for Reliable Operation of High Density DRAM," IEEE VLSI Cir. Symp. Jun. 2001, pp. 33-34.

Maffitt, T. et al., "Design Considerations for MRAM," IBM J. Res. & Dev., vol. 50, No. 1, Jan. 2006, pp. 25-39.

Meng, X.Z. et al., "Reliability Concept for Electrical Fuses," IEE Proc.-Sci Meas. Technol., vol. 144, No. 2, Mar. 1997, pp. 87-92.

Min, Byung-Jun et al., "An Embedded Non-volatile FRAM with Electrical Fuse Repair Scheme and One Time Programming Scheme for High Performance Smart Cards," IEEE CICC, Nov. 2005, pp. 255-258.

Mojumder, N. N. et al., "Three-Terminal Dual-Pillar STT-MRAM for High Performance Robust Memory Applications," IEEE Trans. Elec. Dev. vol. 58. No. 5, May, 2011, pp. 1508-1516.

Morimoto, T. et al., "A NiSi Salicide Technology for Advanced Logic Devices," IEEE IEDM, Dec. 1991, pp. 653-656.

Neale, Ron, "PCM Progress Report No. 6 Afterthoughts," http://www.eetimes.com/General/PrintView/4236240, Feb. 13, 2012, 5 pages.

Nebashi, R. et al., "A 90nm 12ns 32Mb 2T1MTJ MRAM," IEEE ISSCC Dig. of Tech. Paper, Sess. 27.4, Feb. 2009, 3 pages.

Ng, K.P. et al., "Diode-Base Gate Oxide Anti-Fuse One-Time Programmable Memory Array in Standard CMOS Process," IEEE Int. Conf. of Elect. Dev. & Solid-Stat Cir. (EDSSC), Dec. 2009, pp. 457-460.

Ohbayashi, Shigeki et al., "A 65nm Embedded SRAM With Wafer Level Burn-In Mode, Leak-Bit Redundancy and Cu E-Trim Fuse for Known Good Die," IEEE J. of Solid. Stat. Cir., vol. 43, No. 1, Jan. 2008, pp. 96-108.

Oh, G. H. et al., "Parallel Multi-Confined (PMC) Cell Technology for High Density MLC PRAM," IEEE VLSI Tech. Symp., Jun. 2009, pp. 220-221.

Oh, J. H. et al., "Full Integration of Highly Manufacturable 512Mb PRAM Based on 90nm Technology," IEEE IEDM Dig. of Tech. Paper, Dec, 2006, pp. 1-4.

Osada, K. et al., "Phase Change RAM Operated with 1.5V CMOS as Low Cost Embedded Memory," IEEE CICC, Nov. 2005, pp. 431-434.

Park, Don et al., "Study on Reliability of Metal Fuse for Sub-100nm Technology," IEEE Int. Symp. On Semiconductor Manufacturing (ISSM), 2005, pp. 420-421.

Park, Jongwoo et al., "Phase Transformation of Programmed NiSi Electrical Fuse: Diffusion, Agglomeration, and Thermal Stability," 18th IEEE Int. Symp. On Physical and Failure Analysis of Integrated Circuits, (IPFA), 2011, pp. 1-7.

Park, Young-Bae et al., "Design of an eFuse OTP Memory of 8 Bits Based on a 0.35um BCD Process," Mobile IT Convergence (ICMIC), 2011 Int. Conf. on, pp. 137-139.

Pellizzer, F. et al., "Novel uTrench Phase-Change Memory Cell for Embedded and Stand-alone Non-Volatile Memory Applications," IEEE VLSI Tech Symp. Jun. 2004, pp. 18-19.

Peng, J. et al., "A Novel Embedded OTP NVM Using Standard Foundry CMOS Logic Technology," IEEE 21st Non-Volatile Semiconductor Memory Workshop (NVSMW) 2006, pp. 24-26.

Rizzolo, R. F. et al., "IBM System z9 eFUSE applications and methodology," IBM J. Res. & Dev. vol. 51 No. ½ Jan.-Mar., 2007, pp. 65-75.

Robson, Norm et al., "Electrically Programmable Fuse (eFuse) from Memory Redundancy to Autonomic Chips," IEEE CICC, 2007, pp. 799-804.

Russo, U. et al., "Conductive-Filament Switching Analysis and Self-Accelerated Thermal Dissolution Model for Reset in NiO-based RRAM," IEDM, Dec. 2007, pp. 775-778.

Safran, J. et al., "A Compact eFUSE Programmable Array Memory for SOI CMOS," VLSI Cir. Symp. Jun. 2007, pp. 72-73.

Sasaki, Takahiko et al., "Metal-Segregate-Quench Programming of Electrical Fuse," IEEE 43rd IRPS, 2005, pp. 347-351.

Schrogmeier, P. et al., "Time Discrete Voltage Sensing and Iterative Programming Control for a 4F2 Multilevel CBRAM," VLSI Cir. Symp., Jun. 2007, pp. 186-187.

(56) References Cited

OTHER PUBLICATIONS

Sheu, Shyh-Shyuan et al., "A 5ns Fast Write Multi-Level Non-Volatile 1K-bits Rram Memory with Advance Write Scheme," VLSI Cir. Symp., Jun. 2009, pp. 8283.
Sheu, Shyh-Shyuan et al., "Fast-Write Resistive RAM (RRAM) for Embedded Applications," IEEE Design & Test of Computers, Jan.-Feb., 2011, pp. 64-71.
Shi, Min et al., "Zero-Mask Contact Fuse for One-Time-Programmable Memory in Standard CMOS Processes," IEEE Dev. Lett. vol. 32, No. 7, Jul. 2011, pp. 955-957.
Song, Y. J. et al., "Highly Reliable 256Mb PRAM with Advanced Ring Contact Technology and Novel Encapsulating Technology," IEEE VLSI Tech Symp., Jun. 2006, pp. 153-154.
Suto, Hiroyuki et al., "Programming Conditions for Silicided Poly-Si or Copper Electrically Programmable Fuses," IEEE IIRW Final Report, 2007, pp. 84-89.
Suto, Hiroyuki et al., "Study of Electrically Programmable Fuses Through Series of I-V Measurements," IEEE IIRW Final Report, 2006, pp. 83-86.
Suto, Hiroyuki et al., "Systematic Study of the Dopant-Dependent Properties of Electrically Programmable Fuses With Silicide Poly-Si Links Through a Series of I-V Measurements," IEEE Trans. on Dev. Mat. Rd. vol. 7, No. 2, Jun. 2007, pp. 285-297.
Takaoka, H. et al., A Novel Via-fuse Technology Featuring Highly Stable Blow Operation with Large On-off Ratio for 32nm Node and Beyond, IEDM, 2007, pp. 43-46.
Tehrani, S. et al., "Magnetoresistive Random Access Memory Using Magnetic Tunnel Junction," Proc. of IEEE, vol. 91, No. 5, May 2003, pp. 703-714.
Tehrani, S., "Status and Outlook of MRAM Memory Technology," IEEE IEDM Dig. of Tech Paper., Dec. 2006, pp. 1-4.
Teichmann, J. et al., "One Time Programming (OTP) with Zener Diodes in CMOS Processes," 33rd Conf. on European Solid-State Device Research (ESSDERC), 2003, pp. 433-436.
Tian, C. et al., "Reliability Investigation of NiPtSi Electrical Fuse with Different Programming Mechanisms," IEEE IIRW Final Report, 2007, pp. 90-93.
Tian, C. et al., "Reliability Qualification of CoSi2 Electrical Fuse for 90nm Technology," IEEE 44th IRPS, 2006, pp. 392-397.
Tian, Chunyan et al., "Reliability Investigation of NiPtSi Electrical Fuse with Different Programming Mechanisms," IEEE Trans. on Dev. Mat. Rd. vol. 8, No. 3, Sep. 2008, pp. 536-542.
Tonti, W. R. et al., "Product Specific Sub-Micron E-Fuse Reliability and Design Qualification," IEEE IIRW Final Report, 2003, pp. 36-40.
Tonti, W. R., "Reliability and Design Qualification of a Sub-Micro Tungsten Silicide E-Fuse," IEEE IRPS Proceedings, 2004, pp. 152-156.
Tonti, W. R., "Reliability, Design Qualification, and Prognostic Opportunity of in Die E-Fuse," IEEE Conference on Prognostics and Health Management (PHM), 2011, pp. 1-7.
Ueda, T. et al., "A Novel Cu Electrical Fuse Structure and Blowing Scheme utilizing Crack-assisted Mode for 90-45nm-node and beyond," IEEE VLSI Tech. Sym., Jun. 2006, 2 pages.
Ulman, G. et al., "A Commercial Field-Programmable Dense eFUSE Array Memory with 00.999% Sense Yield for 45nm SOI CMOS", ISSCC 2008/ Session 22 / Variation Compensation and Measurement/ 22.4, 2008 IEEE International Solid-State Circuits Conference, pp. 406-407.
Vimercati, Daniele et al., "A 45nm 1Gbit 1.8V PCM for Wireless and Embedded Applications," IEEE ISSCC Feb. 2010, 26 pages.
Vinson, J. E., "NiCr Fuse Reliability—A New Approach," Southcon/94, Conference Record, 1994, pp. 250-255.
Walko, J., "Ovshinsky's Memories," IEE Review, Issue 11, Nov. 2005, pp. 42-45.
Wang, J. P. et al., "The Understanding of Resistive Switching Mechansim in HfO2-Based Resistive Random Access Memory," IEDM, 2011, pp. 12.1.1-12.1.4.
Wikipedia, "Programmable read-only memory", http://en.wikipedia.org/wiki/Programmable6_read-only_memory, downloaded Jan. 31, 2010, 4 pages.

Worledge, D.C., "Single-Domain Model for Toggle MRAM," IBM J. Res. & Dev. vol. 50, No. 1, Jan. 2006, pp. 69-79.
Wu, Kuei-Sheng et al., "The Improvement of Electrical Programmable Fuse with Salicide-Block Dielectrical Film in 40nm CMOS Technology," Interconnect Technology Conference (IITC), 2010 Int. pp. 1-3.
Wu, Kuei-Sheng et al., "Investigation of Electrical Programmable Metal Fuse in 28nm and beyond CMOS Technology," IEEE International Interconnect Technology Conference and 2011 Materials for Advanced Metallization (IITC/MAM), 2011, pp. 1-3.
Yin, M. et al., "Enhancement of Endurance for CuxO based RRAM Cell," 9th Int. Conf. on Solid-State and Integrated-Circuit Technology (ICSICT) 2008, pp. 917-920.
Zhu, Jian-Gang, "Magnetoresistive Random Access Memory: The Path to Competitiveness and Scalability," Proc. Of IEEE, vol. 96, No. 11, Nov. 2008, pp. 1786-1798.
Zhuang, W. W. et al., "Novell Colossal Magnetonresistive Thin Film Nonvolatile Resistance Random Access Memory (RRAM)," IEEE IEDM 2002, pp. 193-196.
Notice of Allowance for U.S. Appl. No. 13/026,664 mailed Sep. 18, 2012.
Office Action for U.S. Appl. No. 13/471,704 mailed Jul. 31, 2012.
Notice of Allowance for U.S. Appl. No. 13/471,704 mailed Oct. 18, 2012.
Notice of Allowance for U.S. Appl. No. 13/026,678 mailed Sep. 19, 2012.
Office Action for U.S. Appl. No. 13/026,783 mailed Sep. 27, 2012.
Office Action for U.S. Appl. No. 13/026,717 mailed Oct. 25, 2012.
Office Action for U.S. Appl. No. 13/026,650 mailed Nov. 9, 2012.
Office Action for U.S. Appl. No. 13/026,692 mailed Nov. 9, 2012.
Office Action for U.S. Appl. No. 13/026,752 mailed Nov. 9, 2012.
Office Action for U.S. Appl. No. 13/026,656 mailed Nov. 13, 2012.
Office Action for U.S. Appl. No. 13/026,704 mailed Nov. 23, 2012.
Office Action for U.S. Appl. No. 13/397,673, mailed Dec. 18, 2012.
Office Action for U.S. Appl. No. 13/026,840, mailed Dec. 31, 2012.
Office Action for U.S. Appl. No. 13/026,852, mailed Jan. 14, 2013.
Office Action for U.S. Appl. No. 13/026,783, mailed Sep. 27, 2012.
Restriction Requirement for U.S. Appl. No. 13/026,835, mailed Dec. 12, 2012.
Notice of Allowance for U.S. Appl. No. 13/026,717, mailed Feb. 12, 2013.
Office Action for U.S. Appl. No. 13/471,704, mailed Jan. 25, 2013.
U.S. Appl. No. 13/761,048 filed Feb. 6, 2013.
U.S. Appl. No. 13/761,057 filed Feb. 6, 2013.
U.S. Appl. No. 13/761,097, filed Feb. 6, 2013.
U.S. Appl. No. 13/761,045, filed Feb. 6, 2013.
Office Action for U.S. Appl. No. 13/026,678, mailed Feb. 20, 2013.
Notice of Allowance for U.S. Appl. No. 13/026,783, mailed Mar. 4, 2013.
Notice of Allowance for U.S. Appl. No. 13/026,692, mailed Mar. 15, 2013.
Office Action for U.S. Appl. No. 13/026,704, mailed Nov. 23, 2012.
Notice of Allowance for U.S. Appl. No. 13/026,835, mailed Mar. 20, 2013.
Notice of Allowance for U.S. Appl. No. 13/026,664, mailed Apr. 22, 2013.
Notice of Allowance for U.S. Appl. No. 13/026,656, mailed Apr. 22, 2013.
Jagasivamani et al., "Development of a Low-Power SRAM Compiler", IEEE Press, 2001, pp. 498-501.
Liu et al., "A Flexible Embedded SRAM Compiler", IEEE Press, 2002, 3 pgs.
Sundrararajan, "OSUSPRAM: Design of a Single Port SRAM Compiler in NCSU FREEPDK45 Process", Mater of Science in Electrical Engineering, Oklahoma State University, Jul. 2010, 117 pgs.
Notice of Allowance for U.S. Appl. No. 13/026,835, Mailed Apr. 18, 2013.
Notice of Allowance for U.S. Appl. No. 13/026,704, mailed Apr. 30, 2013.
Notice of Allowance for U.S. Appl. No. 13/026,852, mailed May 10, 2013.
Notice of Allowance for U.S. Appl. No. 13/026,717, mailed May 15, 2013.

(56) References Cited

OTHER PUBLICATIONS

Notice of Allowance for U.S. Appl. No. 13/471,704, mailed May 22, 2013.
Notice of Allowance for U.S. Appl. No. 13/026,678, mailed May 28, 2013.
Notice of Allowance for U.S. Appl. No. 13/026,650, mailed May 30, 2013.
Restriction Requirement for U.S. Appl. No. 13/314,444, mailed Jun. 7, 2013.
Restriction Requirement for U.S. Appl. No. 13/214,198, mailed Jun. 13, 2013.
Notice of Allowance for U.S. Appl. No. 13/026,840, mailed Jun. 13, 2013.
Restriction Requirement for U.S. Appl. No. 13/026,771, mailed Jun. 13, 2013.
Notice of Allowance for U.S. Appl. No. 13/026,752, mailed Jul. 1, 2013.
Restriction Requirement for U.S. Appl. No. 13/678,543, mailed Jul. 8, 2013.
Office Action for U.S. Appl. No. 13/026,725, mailed Jul. 19, 2013.
Notice of Allowance for U.S. Appl. No. 13/026,664, mailed Jul. 22, 2013.
Notice of Allowance for U.S. Appl. No. 13/026,692, mailed Jul. 23, 2013.
Notice of Allowance for U.S. Appl. No. 13/397,673, mailed Jul. 30, 2013.
Notice of Allowance for U.S. Appl. No. 13/026,704, mailed Aug. 2, 2013.
Notice of Allowance for U.S. Appl. No. 13/026,783, mailed Aug. 5, 2013.
Office Action for U.S. Appl. No. 13/214,198, mailed Aug. 6, 2013.
Office action for Chinese Patent Application No. 201110279954.7, mailed Jul. 1, 2013.
Shen et al., "High-K Metal Gate Contact RRAM (CRRAM) in Pure 28 nm CMOS Logic Process", Electron Devices Meeting (IEDM), 2012 IEEE International, Dec. 2012, 4 pgs.
Tseng et al., "A New High-Density and Ultrasmall-Cell Size Contact Rram (CR-RAM) with Fully CMOS-Logic-Compatible Technology and Circuits", IEEE Transactions on Electron Devices, vol. 58, Issue 1, Jan. 2011, 6 pgs.
Office Action for U.S. Appl. No. 13/026,783, mailed Sep. 9, 2013.
Office Action for U.S. Appl. No. 13/314,444, mailed Sep. 9, 2013.
Office Action for U.S. Appl. No. 13/026,771, mailed Sep. 9, 2013.
Notice of Allowance for U.S. Appl. No. 13/026,852, mailed Sep. 18, 2013.
Office Action (Ex Parte) for U.S. Appl. No. 13/678,543, mailed Sep. 20, 2013.
Office Action for U.S. Appl. No. 13/835,308, mailed Sep. 27, 2013.
Notice of Allowance for U.S. Appl. No. 13/026,717, mailed Oct. 1, 2013.
Office Action for U.S. Appl. No. 13/954,831, mailed Oct. 1, 2013.
Notice of Allowance for U.S. Appl. No. 13/026,656, mailed Oct. 4, 2013.
Office Action for U.S. Appl. No. 13/214,183, mailed Oct. 25, 2013.
Chua, "Many Times Programmable z8 Microcontroller", e-Gizmo.cim, Nov. 21, 2006, pp. 1-5.
Forum, Intel Multi-byte Nops, asmcommunity.net, Nov. 21, 2006, pp. 1-5.
CMOS Z8 OTP Microcontrollers Product Specification, Zilog Inc., May 2008, Revision 1, pp. 1-84.
OTP Programming Adapter Product User Guide, Zilog Inc., 2006, pp. 1-3.
Notice of Allowance for U.S. Appl. No. 13/026,852, mailed Nov. 15, 2013.
Notice of Allowance for U.S. Appl. No. 13/026,835, mailed Nov. 22, 2013.
Notice of Allowance for U.S. Appl. No. 13/026,725, mailed Dec. 10, 2013.
Office Action for U.S. Appl. No. 13/026,783, mailed Dec. 23, 2013.
Notice of Allowance for U.S. Appl. No. 13/026,771, mailed Jan. 15, 2014.
Office Action for Chinese Patent Application No. 201110244362.1, mailed Sep. 29, 2013.
Office Action for Chinese Patent Application No. 201110235464.7, mailed Oct. 8, 2013.
Office Action for Chinese Patent Application No. 201110244400.3, mailed Nov. 5, 2013.
Office Action for Chinese Patent Application No. 201110244342.4, mailed Oct. 31, 2013.
Restriction Requirement for U.S. Appl. No. 13/678,541, mailed Feb. 28, 2014.
Notice of Allowance for U.S. Appl. No. 13/026,840, mailed Mar. 6, 2014.
Notice of Allowance for U.S. Appl. No. 13/026,840, mailed Mar. 10, 2014.
Notice of Allowance of U.S. Appl. No. 13/678,543, mailed Dec. 13, 2013.
Notice of Allowance for U.S. Appl. No. 13/835,308, mailed Mar. 14, 2014.
Notice of Allowance for U.S. Appl. No. 13/026,835, mailed Mar. 14, 2014.
Notice of Allowance for U.S. Appl. No. 13/026,725, mailed Mar. 31, 2014.
Notice of Allowance for U.S. Appl. No. 13/026,852, mailed Mar. 20, 2014.
Notice of Allowance for U.S. Appl. No. 13/026,771, mailed Mar. 18, 2014.
Final Office Action for U.S. Appl. No. 13/214,183, mailed Apr. 17, 2014.
"Embedded Systems/Mixed C and Assembly Programming", Wikibooks, Aug. 6, 2009, pp. 1-7.
Notice of Allowance for U.S. Appl. No. 13/761,097, mailed Jul. 15, 2014.
Office Action for U.S. Appl. No. 13/571,797, mailed Apr. 24, 2014.
Notice of Allowance for U.S. Appl. No. 13/590,044, mailed Apr. 29, 2014.
Notice of Allowance for U.S. Appl. No. 13/954,831, mailed May 27, 2014.
Notice of Allowance of U.S. Appl. No. 13/833,044, mailed May 29, 2014.
Notice of Allowance for U.S. Appl. No. 13/761,048, mailed Jun. 10, 2014.
Office Action for Taiwanese Patent Application No. 100129642, mailed May 19, 2014 (with translation).
Notice of Allowance for U.S. Appl. No. 13/026,840, mailed Jun. 24, 2014.
Notice of Allowance for U.S. Appl. No. 13/214,198, mailed Jun. 23, 2014.
Notice of Allowance for U.S. Appl. No. 13/590,044, mailed Jun. 23, 2014.
Ker et al., "MOS-bounded diodes for on-chip ESD protection in a 0.15-µ m shallow-trench-isolation salicided CMOS Process" International Symposium on VLSI Technology, Systems and Applications, 2003, 5 pgs.
Notice of Allowance for U.S. Appl. No. 13/840,965, mailed Jun. 25, 2014.
Office Action for U.S. Appl. No. 13/970,562, mailed Jun. 27, 2014.
Office Action for U.S. Appl. No. 13/835,308, mailed Jun. 27, 2014.
Notice of Allowance for U.S. Appl. No. 13/288,843, mailed Jul. 8, 2014.
Restriction Requirement for U.S. Appl. No. 13/678,539, mailed Jul. 1, 2014.
Notice of Allowance for U.S. Appl. No. 14/231,413, mailed Jul. 18, 2014.
Notice of Allowance for U.S. Appl. No. 13/590,044, mailed Jul. 23, 2014.
Restriction Requirement for U.S. Appl. No. 13/833,067, mailed Jul. 11, 2014.
Notice of Allowance for U.S. Appl. No. 13/954,831, mailed Aug. 4, 2014.
Restriction Requirement for U.S. Appl. No. 13/678,544, mailed Aug. 1, 2014.

(56) References Cited

OTHER PUBLICATIONS

Notice of Allowance for U.S. Appl. No. 13/761,097, mailed Jul. 25, 2014.
Ex parte Quayle for U.S. Appl. No. 13/761,057, mailed Aug. 8, 2014.
Final Office Action for U.S. Appl. No. 13/314,444, mailed May 14, 2014.
Corrected Notice of Allowability for U.S. Appl. No. 13/288,843, mailed Aug. 19, 2014.
Office Action for U.S. Appl. No. 13/590,049, mailed Aug. 29, 2014.
Ex Parte Quayle for U.S. Appl. No. 13/590,047, mailed Aug. 29, 2014.
Ex Parte Quayle for U.S. Appl. No. 13/590,050, mailed Sep. 3, 2014.
Office Action for U.S. Appl. No. 13/678,544, mailed Sep. 12, 2014.
Office Action for U.S. Appl. No. 13/678,539, mailed Sep. 10, 2014.
Notice of Allowance for U.S. Appl. No. 13/288,843, mailed Sep. 18, 2014.
Notice of Allowance for U.S. Appl. No. 13/761,057, mailed Sep. 26, 2014.
Notice of Allowance for U.S. Appl. No. 13/833,044, mailed Sep. 24, 2014.
Notice of Allowance for U.S. Appl. No. 13/314,444, mailed Sep. 24, 2014.
Office Action for U.S. Appl. No. 13/761,045, mailed Sep. 30, 2014.
Notice of Allowance for U.S. Appl. No. 13/835,308, mailed Oct. 10, 2014.
Notice of Allowance for U.S. Appl. No. 13/571,797, mailed Oct. 14, 2014.
Office Action for U.S. Appl. No. 13/833,067, mailed Oct. 20, 2014.
Notice of Allowance for U.S. Appl. No. 14/085,228, mailed Oct. 23, 2014.
Office Action for U.S. Appl. No. 13/842,824, mailed Oct. 29, 2014.
Herner et al., "Vertical p-i-n Polysilicon Diode with Antifuse for stackable Field-Programmable ROM", IEEE Electron Device Letters, vol. 25, No. 5, pp. 271-273, May 2004.
Notice of Allowance for U.S. Appl. No. 13/590,049, mailed Nov. 25, 2014.
Notice of Allowance for U.S. Appl. No. 13/590,047, mailed Nov. 24, 2014.
Office Action for U.S. Appl. No. 13/590,044, mailed Dec. 9, 2014.
Notice of Allowance for U.S. Appl. No. 13/590,050, mailed Dec. 18, 2014.
Office Action for U.S. Appl. No. 14/042,392, mailed Dec. 31, 2014.
Office Action for U.S. Appl. No. 14/071,957, mailed Dec. 29, 2014.
International Search Report and Written Opinion for International Patent Application No. PCT/US/2014/056676, mailed Dec. 19, 2014.
Office Action for U.S. Appl. No. 14/493,083, mailed Jan. 8, 2015.
Office Action for Chinese Patent Application No. 2011102443903, mailed Dec. 16, 2014 (with translation).
Notice of Allowance for U.S. Appl. No. 13/970,562, mailed Jan. 23, 2015.
Notice of Allowance for U.S. Appl. No. 14/493,069, mailed Feb. 17, 2015.
Notice of Allowance for U.S. Appl. No. 14/085,228, mailed Feb. 18, 2015.
Notice of Allowance for U.S. Appl. No. 13/761,045, mailed Feb. 18, 2015.
Notice of Allowance for U.S. Appl. No. 14/231,404, mailed Jan. 22, 2015.
Notice of Allowance for U.S. Appl. No. 14/021,990, mailed Dec. 9, 2014.
Final Office Action for U.S. Appl. No. 13/678,544, mailed Feb. 15, 2015.
Office Action for U.S. Appl. No. 14/101,125, mailed Mar. 6, 2015.
Hassan, "Argument for anti-fuse non-volatile memory in 28nm high-k metal gate", Feb. 15, 2011, wwwl.eeetimes.com publication.
Office Action for U.S. Appl. No. 13/026,783, mailed on Mar. 5, 2015.
Final Office Action for U.S. Appl. No. 13/678,539, mailed Apr. 1, 2015.
Office Action for U.S. Appl. No. 14/636,155, mailed on Apr. 10, 2015.
Notice of Allowance for U.S. Appl. No. 14/021,990, mailed Apr. 14, 2015.
Notice of Allowance for U.S. Appl. No. 13,842,824, mailed Apr. 14, 2015.
Notice of Allowance for U.S. Appl. No. 14/071,957, mailed Apr. 14, 2014.
Notice of Allowance for U.S. Appl. No. 14/231,404, mailed Apr. 17, 2015.
Notice of Allowance for U.S. Appl. No. 13/590,444, mailed May 12, 2015.
Notice of Allowance for U.S. Appl. No. 13,833,067, mailed Jun. 5, 2015.
Office Action for U.S. Appl. No. 13/314,444, mailed Dec. 10, 2014.
Final Office Action for U.S. Appl. No. 13/026,783, mailed Jul. 30, 2015.
Notice of Allowance for U.S. Appl. No. 14/553,874, Aug. 10, 2015.
Office Action for U.S. Appl. No. 14/500,743, mailed Aug. 17, 2015.
Notice of Allowance for U.S. Appl. No. 14/042,392, mailed Aug. 21, 2015.
Office Action for U.S. Appl. No. 14/485,696, mailed Aug. 20, 2015.
Notice of Allowance for U.S. Appl. No. 14/493,083, mailed Aug. 27, 2015.
Office Action for U.S. Appl. No. 13/678,539, mailed Sep. 16, 2015.
Office Action for Taiwanese Patent Application No. 100128468, mailed Dec. 8, 2014 (with translation).

* cited by examiner

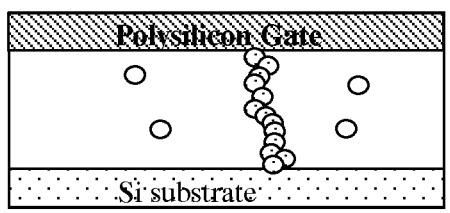
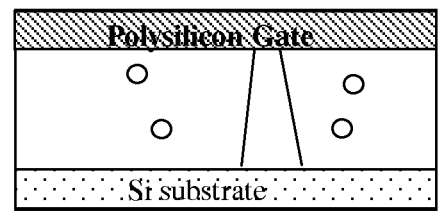
Fig. 2(a) Soft breakdown	Fig. 2(b) Hard breakdown

CIRCUIT AND SYSTEM OF AGGREGATED AREA ANTI-FUSE IN CMOS PROCESSES

CROSS-REFERENCE TO RELATED APPLICATIONS

This application claims priority benefit of U.S. Provisional Patent Application No. 61/372,484, filed on Aug. 11, 2010 and entitled "Circuit and System of Aggregated Area Anti-Fuse in CMOS Devices," which is hereby incorporated herein by reference.

BACKGROUND OF THE INVENTION

1. Field of the Invention

The present invention relates to an anti-fuse device and memories, and more particularly, to aggregate area oxide breakdown by enhancing electrical fields near the drain junction, by making channel region more uniform, or by applying alternative polarities of voltage pulses so that program area can be more restricted and programming can be more reliable.

2. Description of the Related Art

One-Time Programmable (OTP) devices can be programmed into a different logic state once and only once in the lifetime. OTP devices allow every integrated circuit die being customized after fabrication. They can be used for chip ID, security key, device trimming, feature selection, memory redundancy, or Programmable ROM (PROM) for Micro-Controller Units (MCUs). Laser fuse is one of the old and mature OTP technologies that has been used widely since 1980s. However, the laser fuse has a large cell size of 150 um2 and can not be shrunken.

As CMOS technologies are scaled, the gate oxide becomes thinner and thinner. In the 65 nm CMOS technology, the gate oxide is only about 15 Å, or 1.5 nm, thick. For such a thin gate oxide, the gate oxide can be easily broken down and be conductive to the silicon substrate by a high voltage during handling or under ESD zapping. However, this property can be turned into constructive applications by using gate oxide breakdown as a One-Time-Programmable (OTP) anti-fuse.

FIG. 1 shows a cross section of a 1.5 T gate oxide breakdown anti-fuse cell 20 according to a prior art. The anti-fuse 20 has an MOS access device 30 and a MOS program device 40 fabricated in standard CMOS processes. The MOS 30 has a polysilicon gate 31 coupled to an Access Wordline (WLA), an N+ source 32 coupled to a bitline (BL), and an N+ drain 33. The MOS 40 has a polysilicon gate 41 coupled to a Program Wordline (WLP), a source 42 coupled to the drain 33 of MOS 30, and a floating drain 22 coupled to a shallow trench isolation (STI). Since the MOS 40 does not have a drain junction, this device is considered half a transistor such that the anti-fuse cell 20 has only 1.5 Transistors (1.5 T). If high voltages are applied to WLP and WLA, and a low voltage is applied to BL, the low voltage can be passed to the source 42 of MOS 40 such that a high voltage will be created between the source 42 and the gate 41 of the MOS 40 to cause oxide breakdown. Before programming there is no conduction path between BL and WLP, when WLA is turned on. However, after programming there can be a conduction path between BL and WLP created, when WLA is turned on. These two conditions represent states 0 and 1, respectively.

Both MOS devices 30 and 40 in FIG. 1 can be fabricated as Lightly Doped Drain (LDD) devices. LDD is a technique to reduce high electrical field near the source or drain junction to alleviate short channel effects so that MOS devices can be scaled further. To fabricate an LDD device, a light dose N− is implanted into MOS regions 26 after polysilicon gates 31 and 41 are patterned and etched. Then spacers 24 are built along the edges of polysilicon gates 31 and 41 near the source and drain regions, i.e. 32 and 33 of MOS 30, and 42 of MOS 40, by depositing oxide or nitride and then etching anisotropically. With spacers 24, the heavy N+ source/drain implant can not penetrate into the lightly-doped regions 26 underneath the spacers so that the lightly doped regions between the source/drain and channel of a MOS act as a buffer to subdue the electrical field near the source/drain junctions. This allows a MOS device being scaled further. To prevent punch-through, a halo implant 27 is implanted underneath the LDD region 26 to create a heavy P+ region to reduce leakage between source and drain, such as 32 and 33 of MOS 30. Generally, the halo implant 27 shares the same mask as the LDD implant 26 in today's CMOS technologies such that P+ halo implant 27 always comes with N− LDD implant 26 into the same area.

A prior art OTP as shown in FIG. 1 suffers many drawbacks. There are three possible program areas 21 in the MOS program device 40, namely LDD 26, halo 27, and channel 28 regions. When a low voltage is passed to the source 42 of the MOS 40 and a high voltage is passed to the gate 41 of the MOS 40, a high electrical field may possibly breakdown the gate oxide in the LDD 26, halo 27, or channel 28 regions. As a result, the program behavior becomes very unpredictable and the conductive current between BL and WLP varies substantially when WLA is turned on. The programming yield is not very high.

Another problem is the so-called oxide "soft breakdown" as shown in FIG. 2(a), referred to Ben Kaczer, et. al, "Impact of MOSFET gate oxide breakdown on digital circuit operation and reliability," in IEEE Trans. on Elec. Dev., 49(3) 500-507, March 2002. Ideally, a gate oxide should be broken down in the dielectrics to create a permanent short by a high voltage applied, the so-called "hard breakdown" as shown in FIG. 2(b). However, in the most cases, the gate oxide seems conductive after applying a high voltage across a thin oxide film. But the gate oxide may become non-conductive again after cycling or burned in. The physical mechanism of a soft breakdown is very complicated. FIG. 2(a) shows a very simple and intuitive explanation. When a high voltage is applied across a thin oxide, the positive high voltage attracts electrons from the silicon substrate into the oxide. The electrons are piled up in the oxide and form a conductive path such that the oxide appears to be shorted. But those electrons are just temporarily trapped and lined up in the oxide to form a conductive path. Furthermore, this conduction path prevents oxide hard breakdown in other areas. Those charges can be easily returned to substrate after cycling many times so that the state 1 may become state 0 again. The soft breakdown effect makes the gate oxide breakdown anti-fuse very unreliable. This mechanism becomes even worse when the gate oxide is thinner.

FIG. 3 shows another prior art of a split-gate oxide breakdown anti-fuse cell 50. The Access device 30 and the Program device 40 in FIG. 1 are merged into one device 50 in FIG. 3 with a split gate 53—a gate with half thick oxide and half thin oxide near the source 55 and drain 52, respectively. The device 50 has an N+ source 55 coupled to a bitline (BL), a gate 53 with half thick oxide and half thin oxide, and a floating drain 52 near an STI. The source 55 edge has a spacer 54, an LDD region 56, a halo implant region 57 underneath the LDD 56, and a channel region 58. Since the programming happens near the thin oxide region, three possible program areas in FIG. 1 are reduced to only one programming area 51 near the drain 52 to improve program reliability. Though the program yield for the device 50 in FIG. 3 could be better than the device 40 in FIG. 1, the device 50 still suffers the soft breakdown issue. Besides, splitting a gate with half of thick and thin oxides can easily contaminate the delicate gate oxide and make fabrication more complicated. As a result, the yield is not high either.

Accordingly, there is a need to invent an OTP device available in standard CMOS technologies and yet offer small size, high yield, and high reliability to satisfy the requirements of an integrated circuit for most applications.

SUMMARY OF THE INVENTION

The invention pertains to an OTP device and memory that use aggregated area to enhance program yield and reliability in breaking down an oxide near junction area and yet without requiring any additional process steps or masks over standard CMOS logic processes to save costs.

The invention pertains to an OTP device and memory that used non-LDD, special implants, and alternative polarity pulses to suppress soft breakdown so that program yield can be high. Blocking LDD and creating special implants can be achieved in standard CMOS processes by simple operations on layout database without incurring any special processing or masks. Thus, no additional costs are needed for the OTP in embedded applications.

BRIEF DESCRIPTION OF THE DRAWINGS

The present invention will be readily understood by the following detailed descriptions in conjunction with the accompanying drawings, wherein like reference numerals designate like structural elements, and in which:

FIG. 2(a) shows a diagram of soft breakdown mechanism.

FIG. 2(b) shows a diagram of hard breakdown mechanism.

DETAILED DESCRIPTION OF THE INVENTION

This invention discloses several embodiments to increase electrical field by blocking the LDD implant, to make channel region more uniform by using special implants, and to suppress soft breakdown by applying voltages with alternative polarities. By doing so, the program yield can be increased substantially while the cell size remains small. The aggregate-area methods described above can be realized by using operations on layout database, thus no additional masks are needed over standard CMOS logic processes.

Figure 1:
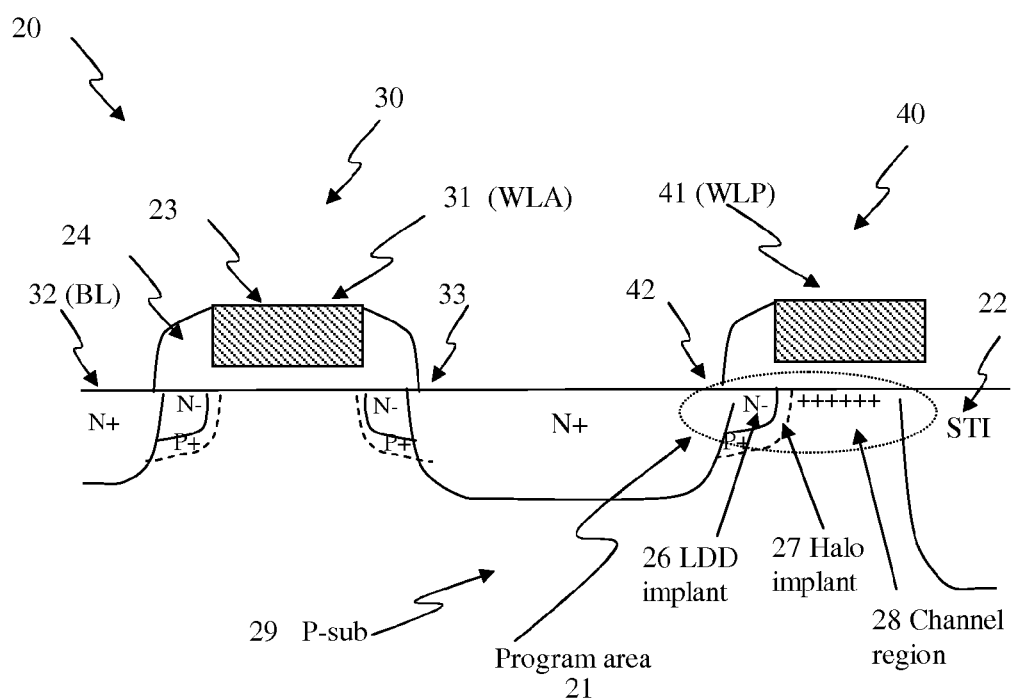
FIG. 1 shows a cross section of a 1.5 T gate oxide breakdown anti-fuse (prior art).
Figure 3:
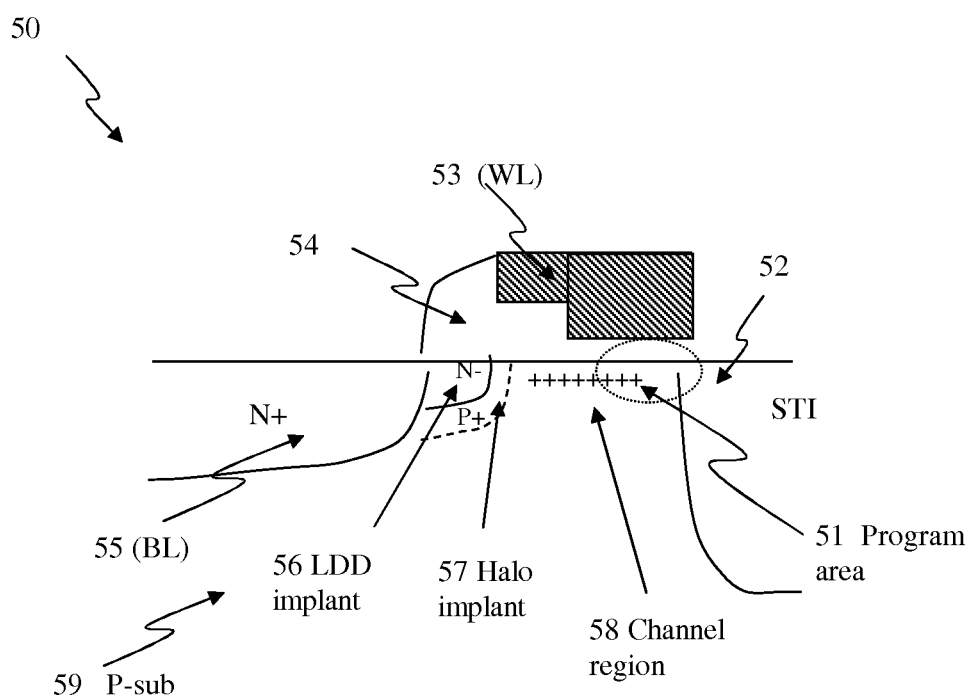
FIG. 3 shows a cross section of a 0.5 T split-gate oxide breakdown anti-fuse (prior art).
Figure 4:
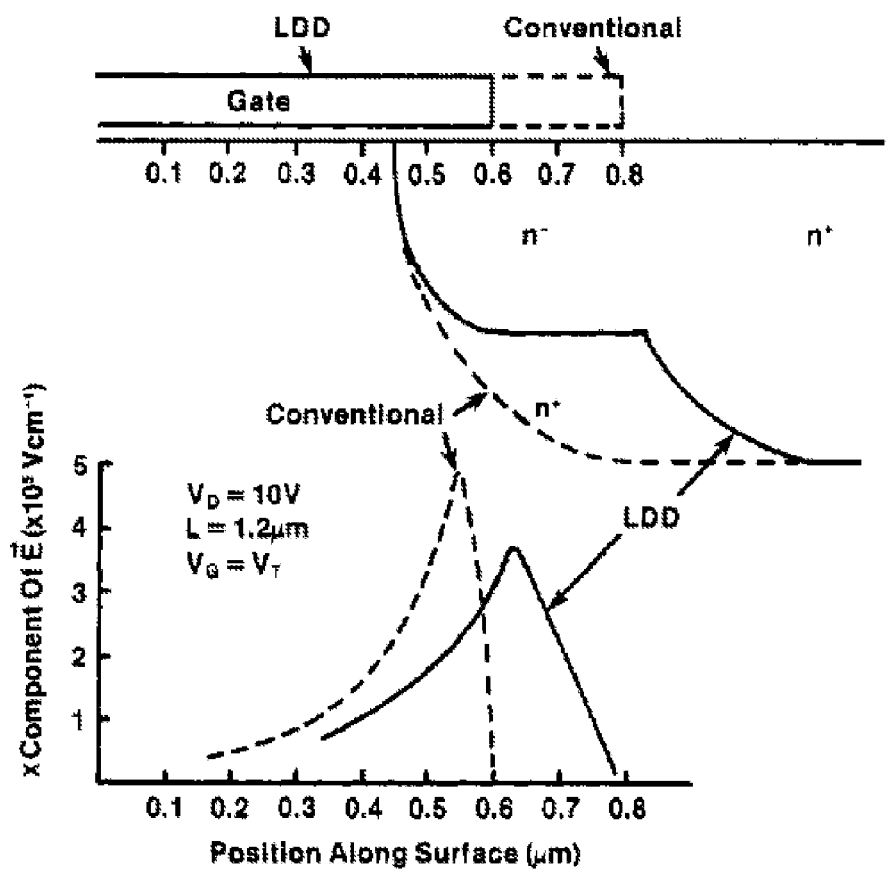
FIG. 4 shows a cross section of an LDD device with doping concentration and electrical field profile.

The anti-fuse cells shown in FIG. 1 and FIG. 3 have drawbacks: (1) non-uniform program area, and (2) soft breakdown issue that can easily plague the program yield and reliability. This invention discloses several embodiments to aggregate program area while suppressing soft breakdown to enhance programmability. FIG. 4 shows a cross section of an LDD device with doping concentration and electrical field profile, referred to Seiki Ogura, et al, "Design and Characteristics of the Lightly Doped Drain-Source (LDD) Insulated Gate Field-Effect Transistor," IEEE Trans. on Elec. Dev. ED-27, No. 8, August 1980, pp. 1359-1367. In contrast to the conventional junction profile, the LDD device has a shallow junction and lighter dopant N− region, rather than heavy N+ region, near the drain junction. Therefore, the electrical field is lower from 0.5 MV/cm to 0.35 MV/cm in peak and spreads more near the drain junction. The LDD technique is suitable for most MOS devices to reduce electrical fields in the channel to enable further scaling. However, this technique is not suitable for anti-fuses to enhance breakdown mechanism. The best way to create hard breakdown is to apply a high voltage to incur high and focused electrical field so that the oxide near the junction edge can be broken down once for all. Thus one of the embodiments in this invention is to block LDD in the program device.

Oxide breakdown has been under extensive studies since 1960s. Recently, this topic attracts more attentions because nanometer devices have oxide thickness of about 1.5 nm, that are more vulnerable to oxide damage and circuit malfunctions. In general, soft breakdown has lower threshold to happen than the hard breakdown, referred to T. Pompl, et al, "Investigation of Ultra-Thin Gate Oxide Reliability Behavior by Separate Characterization of Soft Breakdown and Hard Breakdown," 38$^{th}$ Annual Reliability Physics Symposium, 2000, pp. 40-47. For a oxide thickness of 3.9 nm, the activation energy for hard breakdown is $Ea[eV]=1.9535-0.1197*Eox[MV/cm]$, and the corresponding soft breakdown is $Ea[eV]=0.98-0.07*Eox [MV/cm]$.

If the electrical field Eox is very low, the activation energy Ea of the soft breakdown is lower than the hard breakdown so that soft breakdown happens before hard breakdown. However, if the electrical field Eox is high enough, the activation energy Ea of the hard breakdown may be lower. The cross over point for Eox is about 20 MV/cm, and the voltage across the oxide is 3V when Tox=1.5 nm. Therefore, it is better to apply a high electrical field so that the hard breakdown can happen before the soft breakdown.

Figures 5A, 5B:
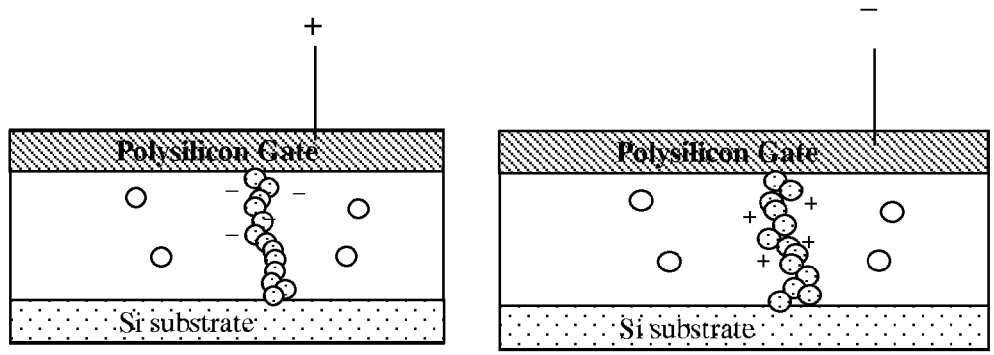
FIG. 5(a) shows a diagram of oxide trapping after applying a positive voltage to a gate.
FIG. 5(b) shows a diagram of oxide trapping after applying a negative voltage to a gate.
Figure 5C:
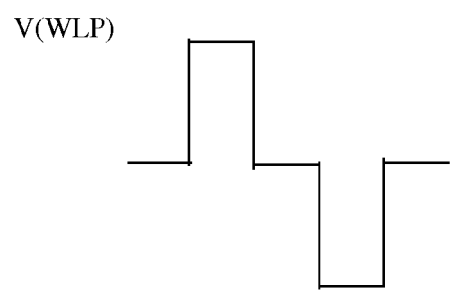
FIG. 5(c) shows a timing waveform with alternative polarity voltages to suppress soft breakdown in accordance with one embodiment.

FIGS. 5(a) and 5(b) show how carriers are trapped in an oxide when a positive and negative voltage is applied between a gate and a silicon substrate, respectively. If a positive voltage is applied to a gate, electrons get attracted to the oxide and piled up there. Similarly, if a negative voltage is applied to the gate, holes get attracted to the oxide and piled up there. The early carrier pile-up creates a conductive path and prevents hard breakdown from being happening. By applying positive and negative voltage pulses alternatively, as shown in FIG. 5(c), carriers piled up in the oxide can be neutralized so that the soft breakdown can be suppressed.

Figure 5D:
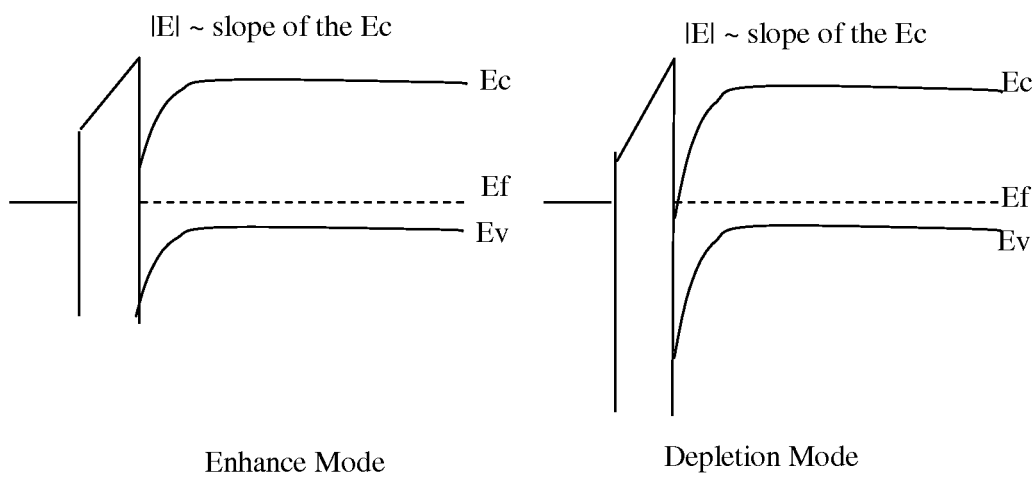
FIG. 5(d) shows a band diagram of an enhancement and depletion NMOS devices.

FIG. 5(d) shows a band diagram of an enhancement and depletion NMOS. When a metal or polysilicon is in contact with a P type semiconductor, the Fermi energies Ef of both sides are aligned at the same level. The conduction band (Ec) and the valence band (Ev) are bent near the surface accordingly. Since the electrical field near the interface is proportional to the slope of the conduction band, the electrical field near the surface is larger for depletion mode than for enhancement. By implanting a portion of a channel into depletion mode, the electrical field near the surface can be increased, hence to increase the possibility of breakdown there. The portion of depletion mode also reduces hot spots that are more vulnerable to soft breakdown.

Based on the above discussions, this invention discloses three methods to make oxide or junction breakdown more predictable. Firstly, block the LDD in the junction that will be programmed. Blocking LDD creates a higher and more focused electrical field near the junction so that hard oxide or junction breakdown can happen easier. Secondly, making the program channel slightly conductive or conductive, instead of total non-conductive in the prior art, can increase the electrical field on the surface and make the electrical field on the surface more uniform. In other words, making a part or all of the program MOS in native or depletion mode, instead of an enhancement mode, can increase the electrical field and make the electrical field more uniform on the silicon surface to reduce the possibilities of breaking down at some particular hot spots in the channel. Thirdly, applying positive and negative pulses alternatively to heal any soft breakdown, if any. With a higher electrical field, more uniform channel, or alternative polarity voltages, hard breakdown can occur once the soft breakdown is suppressed.

Figure 6A:
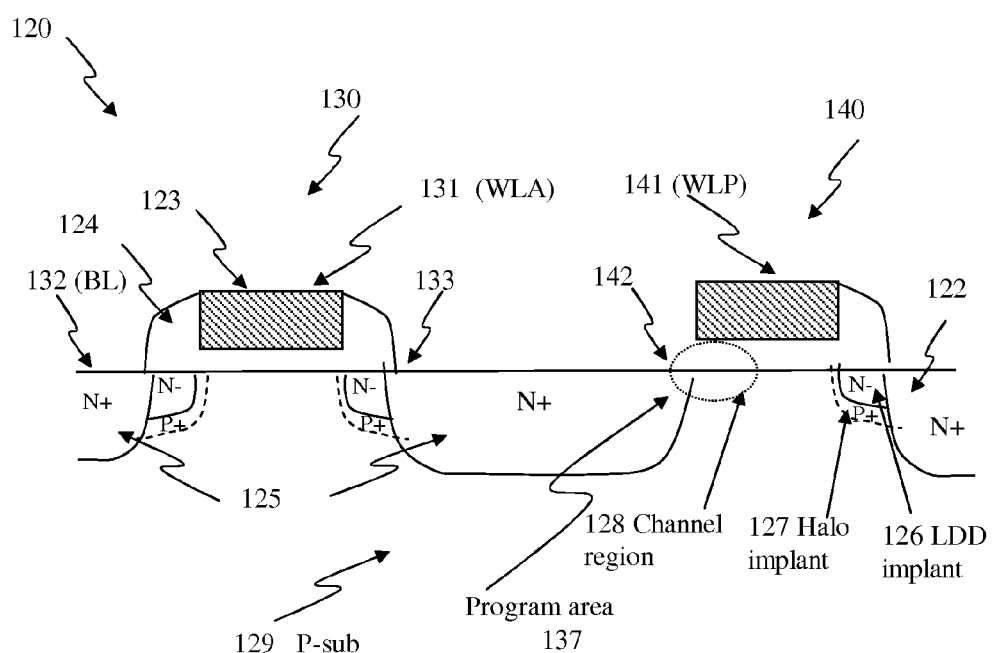
FIG. 6(a) shows a cross section of a 2 T non-LDD anti-fuse cell in accordance with the one embodiment.

FIG. 6(a) shows a cross section of a 2 T non-LDD anti-fuse cell 120 in accordance with one embodiment. The anti-fuse cell 120 has an NMOS access device 130 and a NMOS program device 140 fabricated in standard CMOS processes. The NMOS 130 has a polysilicon gate 131 coupled to an Access Wordline (WLA), an N+ source 132 coupled to a bitline (BL), and an N+ drain 133. The NMOS 140 has a polysilicon gate 141 coupled to a Program Wordline (WLP), a source 142 coupled to the drain 133 of the NMOS 130, and a drain 122. The LDD in the source edge 142 of MOS 140 is blocked to increase the electrical field near the gate 141 and source junction 142 so that program area 137 can be more focused. If high voltages are applied to WLP and WLA, (i.e. 6-7V) and a low voltage is applied to BL (i.e. 0V), the low voltage in BL can be passed to the source 142 of MOS 140 so that a high voltage can be created between the source 142 and the gate 141 of the program device 140 to cause oxide breakdown. The program area 137 can be more restricted to the gate and source junction due to non-LDD. Before programming there is no conduction path between BL and WLP, when WLA is turned on. After programming there can be a conduction path between BL and WLP, (i.e. gate 141 and source 132 appear to be conductive), when WLA is turned on. Those two conditions represent state 0 and 1, respectively.

Figure 6B:
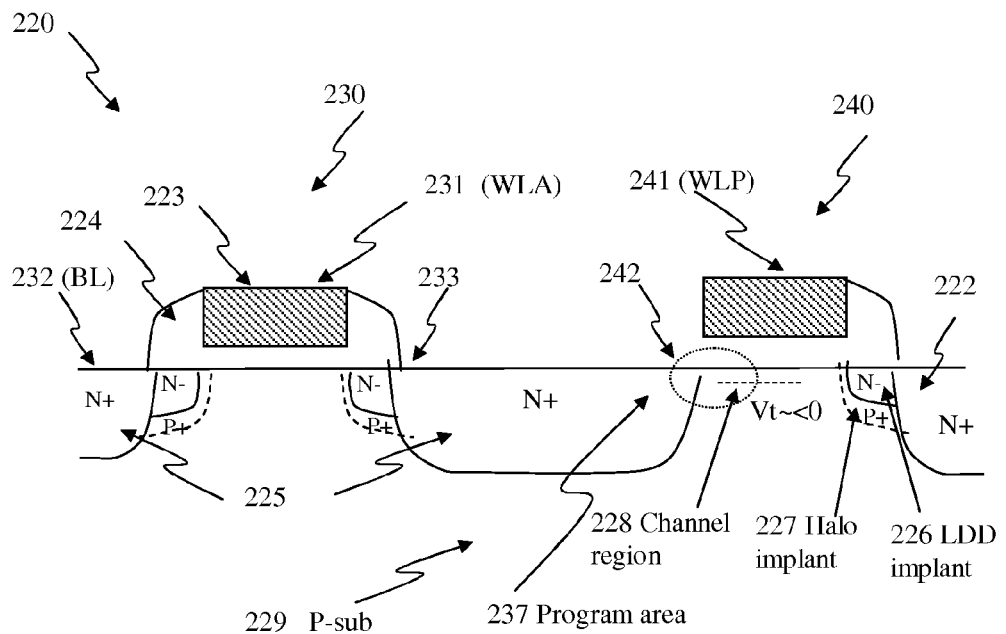
FIG. 6(b) shows a cross section of a 2 T non-LDD and special channel anti-fuse cell in accordance with one embodiment

FIG. 6(b) shows a cross section of a 2 T non-LDD and special channel anti-fuse cell 220 in accordance with one embodiment. The anti-fuse cell 220 has an NMOS access device 230 and a program device 240 fabricated in standard CMOS processes. The NMOS 230 has a polysilicon gate 231 coupled to an Access Wordline (WLA), an N+ source 232 coupled to a bitline (BL), and an N+ drain 233. The NMOS 240 has a polysilicon gate 241 coupled to a Program Wordline (WLP), a source 242 coupled to the drain 233 of NMOS 230, and a drain 222. The LDD in the source edge 242 is blocked to increase the electrical field near the gate 241 and source junction 242 so that program area 237 can be more focused. Furthermore, the channel region of NMOS 240 is implanted slightly conductive or conductive to create a portion of native NMOS or depletion NMOS, respectively, in contrast to the conventional enhance mode NMOS. When the channel is slightly conductive or conductive, the electrical field can be higher and distributed more uniformly in the channel region 228 to avoid hot spots during oxide breakdown. If high voltages are applied to WLP and WLA (i.e. 6-7V), and a low voltage is applied to BL (i.e. 0V), the low voltage can be passed to the source 242 of NMOS 240 so that a high voltage will be created between the source 242 and the gate 241 of the program device 240 to cause oxide breakdown. The program area 237 is restricted to the gate 241 and source junction 242. Before programming there is no conduction path between BL and WLP, when WLA is turned on. After programming there can be a conduction path between BL and WLP, (i.e. gate 241 and source 232 appear to be conductive), when WLA is turned on. Those two conditions represent state 0 and 1, respectively.

Figure 6C:
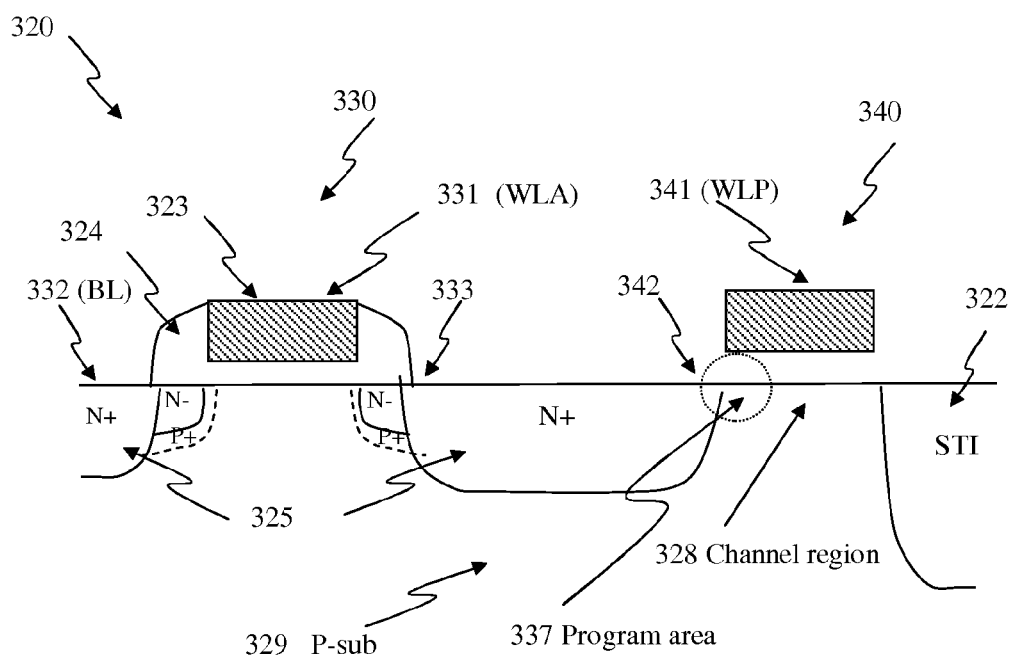
FIG. 6(c) shows a cross section of a 1.5 T non-LDD anti-fuse cell in accordance with one embodiment.

FIG. 6(c) shows a cross section of a 1.5 T non-LDD anti-fuse cell 320 in accordance with one embodiment. The anti-fuse cell 320 has an NMOS access device 330 and a program device 340 fabricated in standard CMOS processes. The NMOS 330 has a polysilicon gate 331 coupled to an Access Wordline (WLA), an N+ source 332 coupled to a bitline (BL), and an N+ drain 333. The NMOS 340 has a polysilicon gate 341 coupled to a Program Wordline (WLP), a source 342 coupled to the drain 333 of NMOS 330, and a floating drain coupled to an STI 322. The LDD in the source edge 342 is blocked to increase the electrical field near the gate 341 and source junction 342 so that program area 337 can be more focused. If high voltages applied to WLP and WLA (i.e. 6-7V), and a low voltage applied to BL (i.e. 0V), the low voltage can be passed to the source 342 of NMOS 340 so that a high voltage will be created between the source 342 and the gate 341 of the program device 340 to cause oxide breakdown. The program area 337 is restricted to the gate 341 and source junction 337. Before programming there is no conduction path between BL and WLP, when WLA is turned on. After programming there can be a conduction path between BL and WLP, (i.e. gate 341 and source 332 appear to be conductive), when WLA is turned on. Those two conditions represent state 0 and 1, respectively.

Figure 6D:
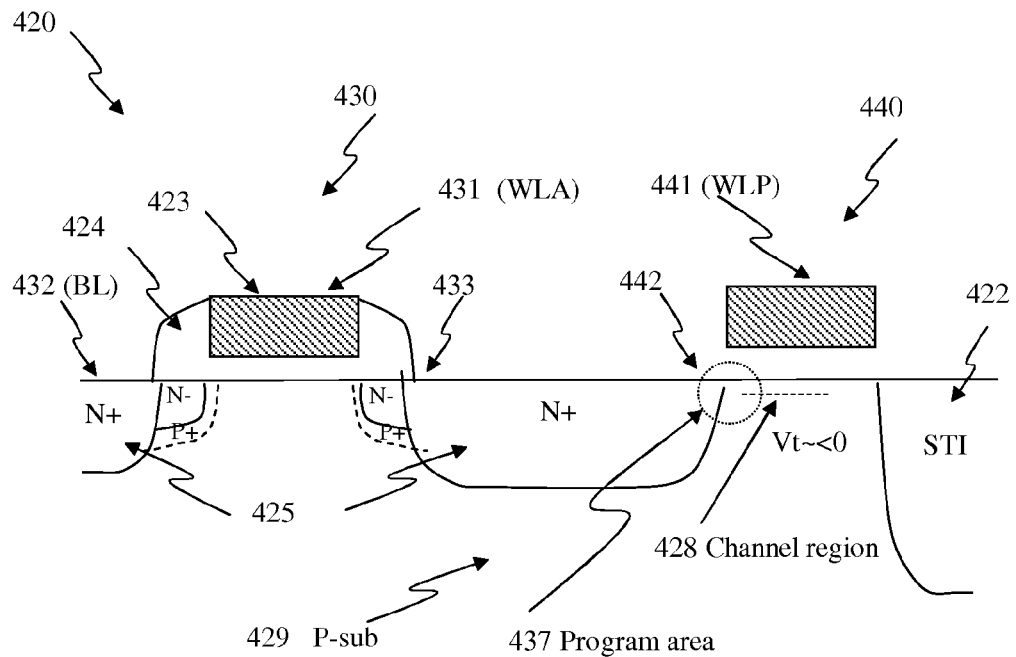
FIG. 6(d) shows a cross section of a 1.5 T non-LDD and special channel anti-fuse cell in accordance with one embodiment.

FIG. 6(d) shows a cross section of a 1.5 T non-LDD and special channel anti-fuse cell 420 in accordance with one embodiment. The anti-fuse cell 420 has an NMOS access device 430 and a program device 440 fabricated in standard CMOS processes. The NMOS 430 has a polysilicon gate 431 coupled to an Access Wordline (WLA), an N+ source 432 coupled to a bitline (BL), and an N+ drain 433. The NMOS 440 has a polysilicon gate 441 coupled to a Program Wordline (WLP), a source 442 coupled to the drain 433 of the NMOS 430, and a floating drain coupled to an STI 422. The LDD in the source edge 442 is blocked to increase the electrical field near the gate 441 and source junction 442 so that program area 437 can be more focused. Furthermore, the channel region of NMOS 440 is implanted slightly conductive or conductive to create a portion of native NMOS or depletion NMOS, respectively, in contrast to the conventional enhance mode NMOS. When the channel is slightly conductive or conductive, the electrical field can be higher and distributed more uniformly in the channel region 428 to avoid any hot spots. If high voltages are applied to WLP and WLA (i.e. 6-7V), and a low voltage is applied to BL (i.e. 0V), the low voltage can be passed to the source 442 of the NMOS 440 such that a high voltage can be created between the source 442 and the gate 441 of the program device 440 to cause oxide breakdown. The program area 437 is restricted to the gate 441 and source junction 437. Before programming there is no conduction path between BL and WLP, when WLA is turned on. After programming there will be a conduction path between BL and WLP, (i.e. gate 441 and source 432 appear to be conductive), when WLA is turned on. Those two conditions represent state 0 and 1, respectively. FIGS. 6(a)-6(d) only show a few of possible embodiments. There are many variations of embodiments with different combinations of LDD/non-LDD, conductive/non-conductive channel, and drain/non-drain region in the invention. Those skilled in the art understand that there are many combinations of embodiments to increase electrical field near source/gate edge or in the channel region and that are still within the scope of this invention.

Figure 7A:
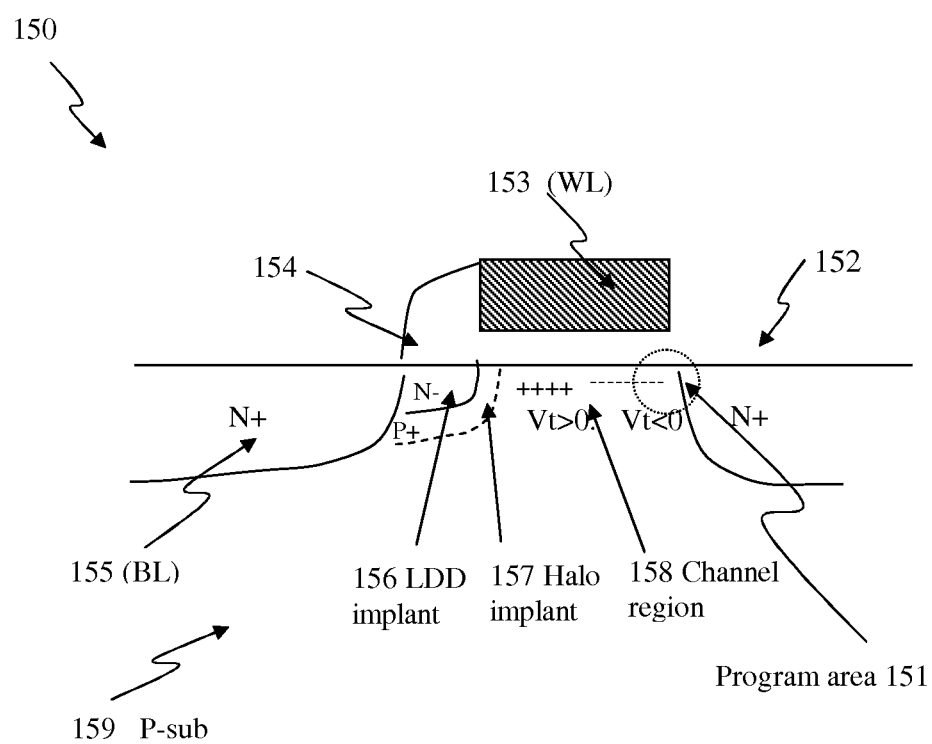
FIG. 7(a) shows a cross section of a 1 T non-LDD anti-fuse cell with special channel in accordance with one embodiment

FIG. 7(a) shows a cross section of a 1 T non-LDD special channel anti-fuse cell 150 in accordance with one embodiment. A single NMOS 150 has a source 155 coupled to a bitline (BL), a gate 153 coupled to a wordline (WL), and a drain 152. The source edge 155 has a spacer 154, an LDD region 156, a halo implant 157 underneath the LDD 156, and a channel region 158. The LDD in the drain edge 152 is blocked to increase the electrical field near the gate 153 and drain junction 152 so that program area 151 can be more focused. Moreover, the channel near the drain 152 is implanted to make the Vt~0 or Vt<0, i.e. a portion of native or depletion mode on the silicon surface, respectively, while the channel near the source 155 is implanted with Vt>0, i.e. a portion of enhancement mode device. With differential implants in a channel, the access and program devices can be merged into one without resorting to a split gate as in FIG. 3. If a high voltage (i.e. 6-7V) is applied to WL, and a low voltage (i.e. 0V) applied to BL, the low voltage can be passed into the channel so that a high voltage can be created between the drain 152 and the gate 153 of the NMOS 150 to cause oxide breakdown. The drain 152 can be let floating during programming. The program area 151 can be restricted to the gate 153 and drain junction 152. Before programming there is no conduction path between BL and WL. After programming there can be a conduction path between BL and WL such that the NMOS 150 behaves like gate 153 and drain 152 are conductive. Those two conditions represent state 0 and 1, respectively. The anti-fuse cell 150 can be readily organized as a two-dimensional array to constitute a memory.

Figure 7B:
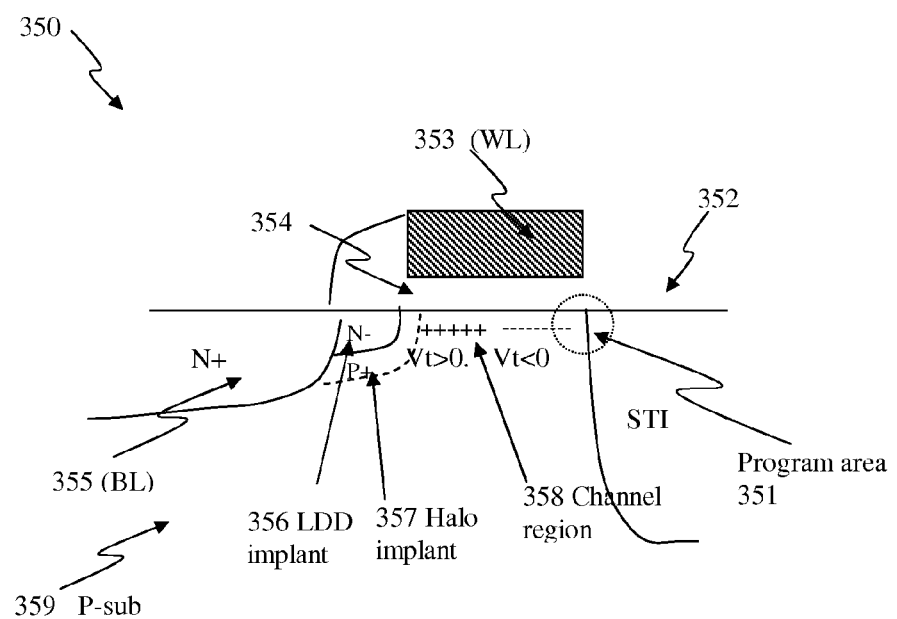
FIG. 7(b) shows a cross section of a 0.5 T non-LDD anti-fuse cell with special channel in accordance with one embodiment

FIG. 7(b) shows a cross section of a 0.5 T non-LDD special channel anti-fuse cell 350 in accordance with one embodiment. A single NMOS 350 has a source 355 coupled to a bitline (BL), a gate 353 coupled to a wordline (WL), and a floating drain coupled to an STI 352. The source edge 355 has a spacer 354, an LDD region 356, a halo implant 357 underneath the LDD 356, and a channel region 358. Moreover, the channel near the drain 352 is implanted with Vt~0 or Vt<0, i.e. a portion of native or depletion mode, respectively, while the channel near the source 355 is implanted with Vt>0, i.e. an enhancement mode. The program area 351 can be restricted to the gate 353 and STI/channel 352. With differential implants in a channel, the access and program devices can be merged into one without resorting to a split gate as in FIG. 3. If a high voltage (i.e. 6-7V) is applied to WL and a low voltage (i.e. 0V) is applied to BL, the low voltage can be passed into the channel 358 such that a high voltage will be created between the STI/channel 352 and the gate 353 of the NMOS 350 to cause oxide breakdown. The program area 357 can be restricted to an area near the gate 353 and STI/channel 352. Before programming there is no conduction path between BL and WL. After programming there can be a conduction path between BL and WL such that the MOS behaves like gate 353 and STI/channel 352 are conductive. Those two conditions represent state 0 and 1, respectively. The anti-fuse cell 350 can be readily organized as a two-dimensional array to constitute a memory. FIG. 7(b) is a more desirable embodiment over FIG. 7(a).

Figure 8A:
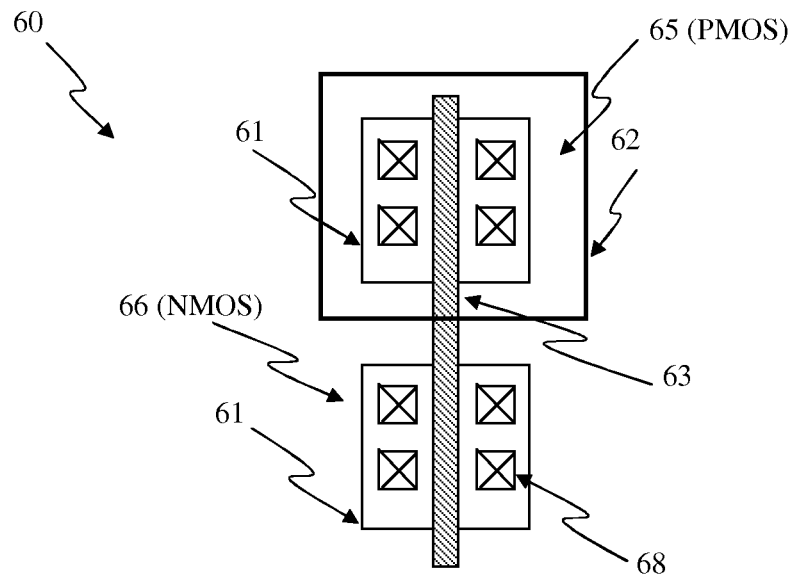
FIG. 8(a) shows a layout of a CMOS inverter.
Figure 8B:
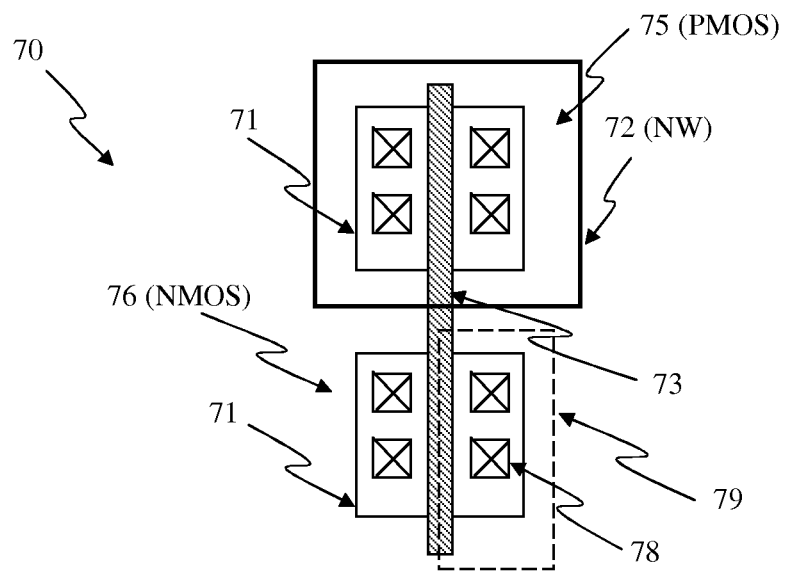
FIG. 8(b) shows a layout of a CMOS inverter with a dummy layer to block NLDD in accordance with the one embodiment.

FIG. 8(a) shows a layout of a CMOS inverter 60. The inverter 60 has a PMOS 65 and NMOS 66; both have a gate 63 and separate active regions 61. The PMOS sits in an N well 62. Contacts 68 couple respective source, drain, and gate to metal layers (not shown) for further interconnect. FIG. 8(b) shows a layout of a CMOS inverter 70 with a dummy layer 79 to block NLDD in accordance with one embodiment. The inverter has a PMOS 75 and NMOS 76; both have a gate 73 and separate active regions 71. The PMOS sits in an N well 72. Contacts 78 couple respective source, drain, and gate to metal layers (not shown) for further interconnect. An NLDD layer 79 covers half of the source/drain of the NMOS 76 and a portion of the NMOS gate 73. In a typical CMOS fabrication process, NLDD layer is usually created from "NOT N well", which is any area outside of the N well 72 that would receive an N− LDD implant for NMOS. Then gate oxide spacers are generated by depositing or growing a thin layer of oxide and etched anisotropically. An N+ implant follows to create source and drain areas. To block NLDD in the right side of source/drain area of the NMOS 76, a layer 79 covers half of the source/drain area 71 and a portion of the gate 73 so that the right side does not undergo any LDD implant and subsequent oxide spacer building process. This can be achieved by operations on layout database in standard CMOS processes without any new masks or process steps.

Figure 9A:
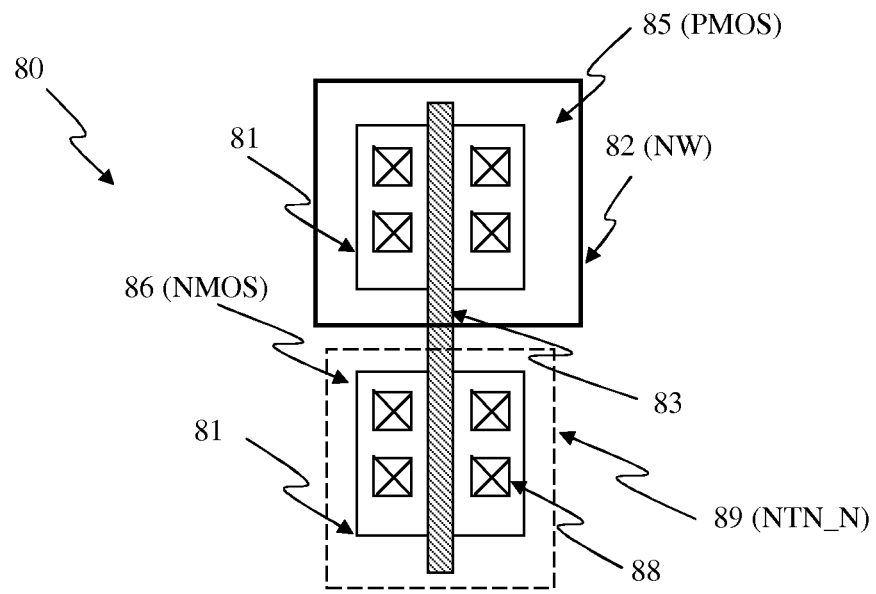
FIG. 9(a) shows a layout a CMOS inverter with a dummy layer to create native NMOS in accordance with one embodiment.

FIG. 9(a) shows a layout of a CMOS inverter 80 with a dummy layer 89 covered to create a native NMOS 86 in accordance with one embodiment. The inverter 80 has a PMOS 85 and NMOS 86; both have a gate 83 and separate active regions 81, i.e. source or drain region. The PMOS sits in an N well 82. Contacts 88 couple respective source, drain, and gate to metal layers (not shown) for further interconnect. A native layer 89 (NTN_N layer) covers the source, drain, and gate of NMOS 86 to blocks threshold voltage (Vt) adjust implant and related field implant so that the NMOS 86 has a threshold voltage of about 0, i.e. Vt~0V. The Vt adjust implant or field implant layers may be block by operations on layout database so that the native NMOS area is considered neither N well nor P well, instead of (not N well) for regular enhancement mode NMOS. There are some variations in CMOS processes that Vt adjust implant may be skipped, new additional implant may be introduced, or operations on layout database may be different, but the end result is to create an NMOS device with threshold voltage near 0V, i.e. Vt~0V. Those skilled in the art understand that the above discussions are for illustrative purpose and any embodiments to create native NMOS devices may vary and that are still within the scope of this invention.

Figure 9B:
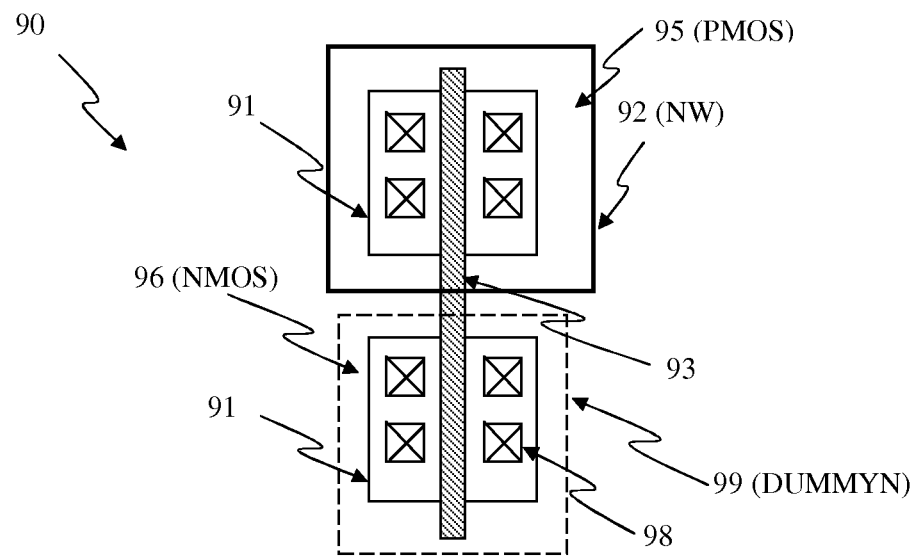
FIG. 9(b) shows a layout of a CMOS inverter with a dummy layer to create depletion NMOS in accordance with one embodiment.

FIG. 9(b) shows a layout of a CMOS inverter 90 with a dummy layer (DUMMYN) 99 to create a depletion NMOS 96 in accordance with one embodiment. The inverter 90 has a PMOS 95 and NMOS 96; both have a gate 93 and separate active regions 91, i.e. source or drain. The PMOS sits in an N well 92. Contacts 98 couple respective source, drain, and gate to metal layers (not shown) for further interconnect. Any N type implants, such Arsenide or Phosphorous, in the channel decrease the threshold voltage of an NMOS to make the surface more conductive. In a typical CMOS process, a channel in a PMOS device tends to have N type implants to adjust threshold voltage or to suppress short channel effects. These implants can be incorporated into the channel of NMOS devices by treating the area covered by DUMMYN as PMOS, i.e. the area to receive PMOS Vt adjustment implant is modified from (N well) to (N well AND DUMMYN). Some other N type implants for PMOS can be used for DUMMYN area as well. There are some variations in CMOS processes that Vt adjust implant may be added or skipped, punch-through suppress implant may be added or skipped, new additional implant may be introduced, or operations on layout database may be different. Those skilled in the art understand that the above discussions are for illustrative purpose and any embodiments to create depletion MOS devices may vary and that are still within the scope of this invention.

The above descriptions on this invention are for exemplifying purposes. There can be many embodiments for this invention based on the above discussions. For examples, the access and program devices can be PMOS instead of NMOS. The mask operations on layer database to block LDD, generate native or depletion NMOS/PMOS devices can be different. The anti-fuse cell can be 2 T with an explicit drain area in the program device or 1.5 T without a drain area in the program device. Similarly, the anti-fuse cell can be 1 T with an explicit drain area in the merged access/program device or 0.5 T without a drain area in access/the program device. Those skilled in the art understand that the embodiments may differ and that are still within the scope of this invention.

Figure 10A:
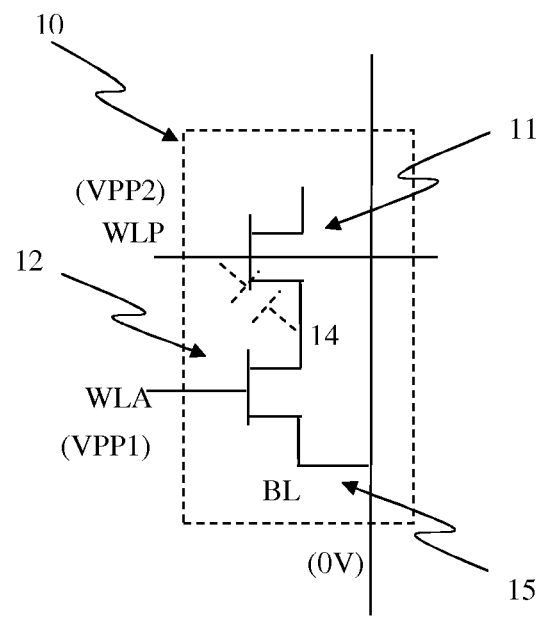
FIG. 10(a) shows an equivalent circuit of a 1.5 T anti-fuse cell before program.
Figure 10B:
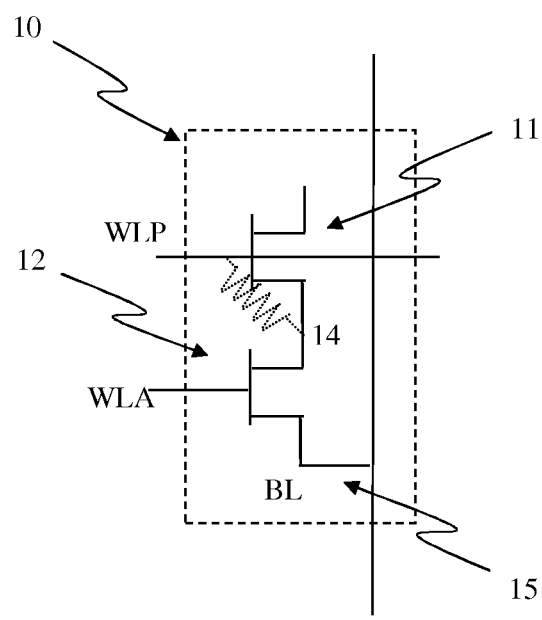
FIG. 10(b) shows an equivalent circuit of a 1.5 T anti-fuse cell after program.

FIGS. 10(a) and 10(b) show equivalent circuits of a 1.5 T anti-fuse cell 10 before and after program. The anti-fuse 10 has an access device 12 and a program device 11. Device 12 has a source coupled to a bitline (BL), a gate coupled to an Access Wordline (WLA), and a drain 14. Device 11 has a source coupled to the drain 14 of device 12, a gate coupled to a Program Wordline (WLP), and a floating drain. To program the anti-fuse cell 10, applied a low voltage (i.e. 0V) to BL, a high voltage (i.e. 6-7V) VPP2 to WLP, and another high voltage (i.e. 1 V) VPP1 to WLA to turn on the access device 12 so that there is a high voltage path from WLP through device 12 to BL to break the oxide in the source side (node 14) of the program device 11. VPP1 can be lower than VPP2 or just high enough to turn on the access device 12. Before programming, the equivalent circuit between WLP and node 14 is open that can be modeled as a fringing capacitor. After programming, the equivalent circuit between WLP and source (node 14) of the program device 11 is conductive that can be modeled as a resistor. This equivalent circuit can be applied to the anti-fuse cells in FIGS. 6(a)-6(d) as well.

Figure 11A:
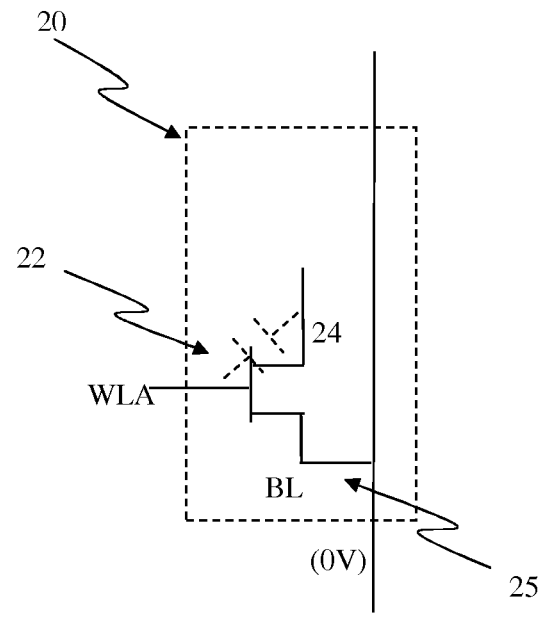
FIG. 11(a) shows an equivalent circuit of a 0.5 T anti-fuse cell before program.
Figure 11B:
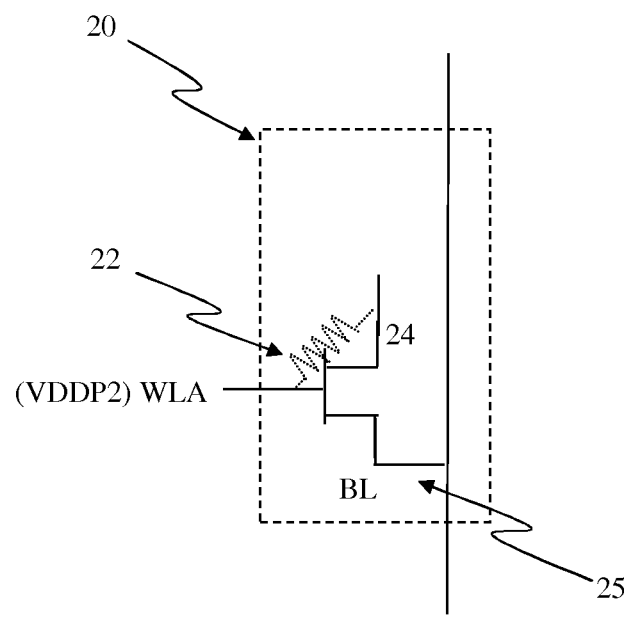
FIG. 11(b) shows an equivalent circuit of a 0.5 T anti-fuse cell after program.

FIGS. 11(a) and 11(b) show equivalent circuits of a 0.5 T anti-fuse cell 20 before and after program. The anti-fuse cell 20 has a merged access and program device 22. Device 22 has a source coupled to a bitline (BL), a gate coupled to an Access Wordline (WLA), and a drain or STI/channel 24. To program the anti-fuse cell 20, applying a low voltage (i.e. 0V) to BL, a high voltage (i.e. 6-7V) to WLA, so that there is a high voltage path from WLA through device 22 to BL. Before programming, the equivalent circuit between WLA and the STI/channel 24 is open that can be modeled as a fringing capacitor. After programming, the equivalent circuit between WLA and the STI/channel 24 is conductive that can be modeled as a resistor. This equivalent circuit can be applied to the anti-fuse cells in FIG. 7(a) as well.

Figure 12:
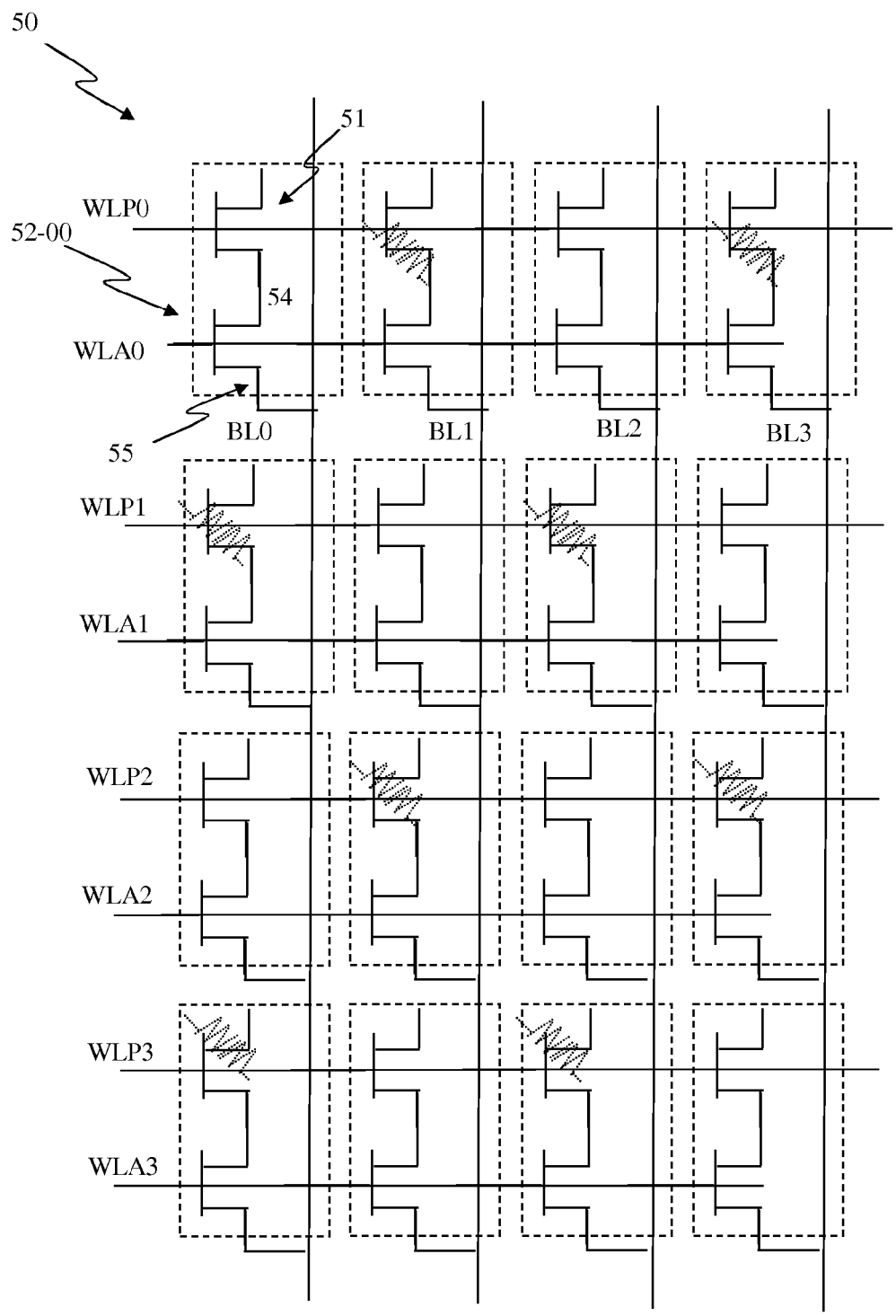
FIG. 12 shows a 4×4 1.5 T anti-fuse cell array with an equivalent circuit of programmed checkboard pattern in accordance with one embodiment.

FIG. 12 shows a 4×4 array 50 of 1.5 T anti-fuse cells programmed in checkboard pattern in accordance with one embodiment. The anti-fuse cell array 50 has 4 rows and 4 columns of anti-fuse cells 52. The anti-fuse cell 52-00 has an access device 55 with a source coupled to BL0, a gate coupled to access gate WLA0, and a drain 54. The anti-fuse cell 52-00 also has a program device 51 with a source coupled to the drain 54 of the access device 55, a gate coupled to program gate WLP0, and a floating drain. The anti-fuse cells 52 are organized as a 4×4 array with the sources of the access device in the same column connected as bitlines BLj (j=0,1,2,3). The gates of the access devices in the same row are connected as WLAi (i=0,1,2,3). The gates of the program devices in the same row are connected as WLPi (i=0,1,2,3).

To select the cell 52-00 for programming, apply 1V to WLA0, 6-7V to WLP0, and 0 to BL0 so that the source 54 of the program device 51 can be programmed to be conductive to WLP0, while keeping the voltages for the unselected cells as 0V, 0V, and 0V to WLP1-WLP3, WLA1-WLA3, and BL1-BL3, respectively. To select the cell 52-00 for reading, apply 1V to WLA0, 1V to WLP0, and pre-charge BL0 to 0V, while keeping the voltages for the unselected cells as 0V, 0V, and 0V to WLP1-WLP3, WLA1-WLA3, and BL1-BL3, respectively. If the cell 52-00 is not programmed, the access device 55 is not turned on that the BL0 remains at 0V. However, if the cell 52-00 is programmed, the BL0 can be conductive to WLP0, or 1 V. If the cell 52-00 is programmed, the source 54 and the gate of the program device 51 are conductive such that the BL0 is conductive to WLP0 when the access device 55 is turned on. The voltage differences in BL0 can be sensed to determine the proper logic states. Those skilled in the art understand that the numbers of row or column may vary, the row and column are interchangeable, the physical directions of the WLPi, WLAi, and BLj may vary, and the voltages applied to WLAi, WLPi, and BLj may vary and that are still within the scope of this invention, where i=0,1,2,3, and j=0, 1,2,3.

Figure 13:
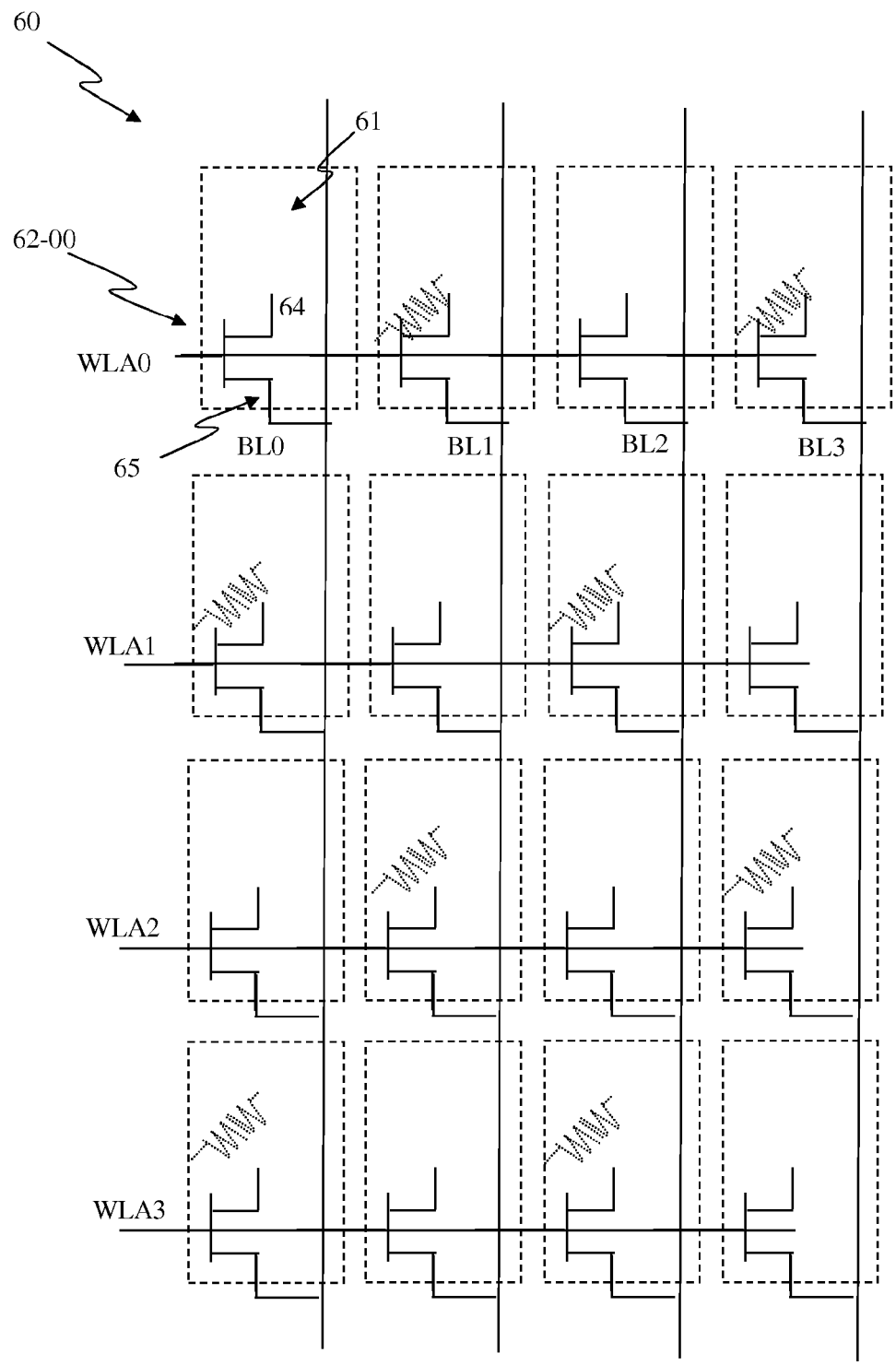
FIG. 13 shows a 4×4 0.5 T anti-fuse cell array with an equivalent circuit of programmed checkboard pattern in accordance with one embodiment.

FIG. 13 shows a 4×4 array 60 of 0.5 T anti-fuse cells programmed with checkboard pattern in accordance with one embodiment. The anti-fuse cell array 60 has 4 rows and 4 columns of anti-fuse cells 62. The anti-fuse cell 62-00 has a merged access and program device 61 with a source 65 coupled to the BL0, a gate coupled to access/program gate WLA0, and a floating drain 64. The anti-fuse cells 62 are organized as a 4×4 array with the sources of the access device in the same column connected as bitlines BLj (j=0,1,2,3). The gates of the access devices in the same row are connected as WLAi (i=0,1,2,3).

To select the cell 62-00 for programming, apply 6-7V to WLA0 and 0 to BL0 so that the floating drain 64 can be conductive to WLA0, while keeping the voltages of the unselected cells as 0V, and 3V to WLA1-WLA3, and BL1-BL3, respectively. To select the cell 62-00 for reading, apply 1V to WLA0, and pre-charge BL0 to 0V, while keeping the voltages for the unselected cells as 0V, and 0V to WLA1-WLA3, and BL1-BL3, respectively. If the cell 62-00 is not programmed, the BL0 remains at 0V. However, if the cell 62-00 is programmed, the BL0 can be clamp to V(WLA0)−Vthn, or 0.3V, where Vthn (i.e. 0.7V) is the threshold voltage of the enhancement mode portion of device 61. If the cell 62-00 is programmed, the drain and the gate of the device 62-00 are conductive such that a diode-connected MOS 61 exists between the WLA0 to BL0 to clamp BL0. This after-programmed configuration allows the anti-fuse cells being organized as a two dimensional array. Those skilled in the art understand that the numbers of row or column may vary, the row and column are interchangeable, the physical directions of the WLAi, and BLj may vary, and the supply voltages may vary and that are still within the scope of this invention.

The invention can be implemented in a part or all of an integrated circuit in a Printed Circuit Board (PCB), or in a system. The MOS in the anti-fuse cell can be either NMOS or PMOS. There are various embodiments in applying voltages to the BL, WLA, or WLP to program or read, and various embodiments to create native or depletion mode in part or all of the devices. There are also various embodiments to block LDD in different source or drain regions. The program device in the anti-fuse cells can have an explicit drain junction or none. The methods to enhance electrical fields and to neutralize carriers piled up can be embodied separately or all, depending on the needs. Various embodiments can be implemented separately or all. They can be combined in part or all and that are still within the scope of this invention.

The many features and advantages of the present invention are apparent from the written description and, thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. An anti-fuse memory comprises:
   a plurality of anti-fuse cells, at least one of the cells comprising:
   a first MOS having a gate coupled to an access wordline (WLA), and a first active region coupled to a bitline (BL);
   a second MOS having a gate coupled to a program wordline (WLP), a first active region coupled to the second active region of the first MOS;
   the first active region of the second MOS being blocked Lightly-Doped Drain-Source (LDD) region; and
   the anti-fuse cell being configured to be programmable into another logic state by applying a first voltage supply to the bitline, a second voltage supply to the access wordline, and a third voltage supply to the program wordline so that the bitline being conductive to the program wordline when the first MOS being turned on.

2. An anti-fuse cell as recited in claim 1, wherein the second MOS does not have any second active region.

3. An anti-fuse cell as recited in claim 1, wherein the second MOS is a native device in part or all.

4. An anti-fuse cell as recited in claim 1, wherein the second MOS is a depletion-mode device in part or all.

5. An anti-fuse cell as recited in claim 1, wherein the first voltage supply is at a fixed voltage, the magnitude of the second to the first supply voltage is high enough to turn on the first MOS, and the third to the first voltage supply has a magnitude higher than the second to the first voltage supply during programming.

6. An anti-fuse cell as recited in claim 1, wherein the first voltage supply is at a fixed voltage, the magnitude of the second to the first voltage supply is high enough to turn on the first MOS, and the third to the first voltage supply is applied with positive and negative pulses alternatively during programming.

7. An anti-fuse cell as recited in claim 1, wherein the first voltage supply is at a fixed voltage, the magnitude of the second to the first voltage supply is applied to turn on the first MOS, and the resistance between the program wordline and the bitline is sensed to determine the logic state during read.

8. An anti-fuse memory as recited in claim 1, wherein the access wordlines and the program wordlines of the cells are in a first direction and the BLs of the cells are in a second direction perpendicular to the first direction.

9. An electronics system comprises:
   a processor;
   at least one anti-fuse memory operatively connected to the processor, the anti-fuse memory comprises a plurality of anti-fuse cells, at least one of the cells comprising:
   a first MOS having a gate coupled to an access wordline (WLA), and a first active region coupled to a bitline (BL);
   a second MOS having a gate coupled to a program wordline (WLP), a first active region coupled to the second active region of the first MOS;
   the first active region of the second MOS being blocked Lightly-Doped Drain-Source (LDD) region; and
   the anti-fuse cell being configured to be programmable into another logic state by applying a first voltage supply to the bitline, a second voltage supply to the access wordline, and a third voltage supply to the program wordline so that the bitline being conductive to the program wordline when the first MOS being turned on.

10. A method for providing anti-fuse memory comprises:
    providing a plurality of anti-fuse cells, at least one of the cells comprises:
    a first MOS having a gate coupled to an access (WLA), and a first active region coupled to a bitline (BL);
    a second MOS having a gate coupled to a program wordline (WLP), a first active region coupled to the second active region of the first MOS; and
    the first active region of the second MOS is blocked Lightly-Doped Drain-Source (LDD) region; and
    providing a first voltage supply to the bitline, a second voltage supply to the access wordline, and a third voltage supply to the program wordline so that the anti-fuse cell being configured to be programmable into another logic state by making the bitline conductive to the program wordline, when the first MOS being turned on.

11. An anti-fuse memory comprises:
    a plurality of anti-fuse cells, at least one of the cells comprising:
    a MOS having a gate coupled to an access (WLA), and a first active region coupled to a bitline (BL);
    a part or all of the channel region of the MOS being conductive; and
    the anti-fuse cell being configured to be programmable into another logic state by applying a first voltage supply to the bitline and a second voltage supply to the access wordline, so that the bitline being conductive to the access wordline when the MOS being turned on.

12. An anti-fuse cell as recited in claim 11, wherein the MOS does not have any second active region.

13. An anti-fuse cell as recited in claim 11, wherein the MOS has a second active region that is blocked Lightly Doped Drain (LDD) region.

14. An anti-fuse cell as recited in claim 11, wherein the first voltage supply is at a fixed voltage, the magnitude of the second to the first supply voltage is high enough to break down the gate oxide during programming.

15. An anti-fuse cell as recited in claim 11, wherein the first voltage supply is at a fixed voltage, the second to the first voltage supply is applied with positive and negative pulses alternatively during programming.

16. An anti-fuse cell as recited in claim 11, wherein the second voltage supply is applied to turn on the MOS, and the resistance between the access wordline and the bitline is sensed to determine the logic state during read.

17. An anti-fuse memory as recited in claim 11, wherein the access wordlines of the cells are in a first direction and the bitlines of the cells are in a second direction perpendicular to the first direction.

* * * * *